(12) United States Patent
Erhart et al.

(10) Patent No.: US 9,406,580 B2
(45) Date of Patent: Aug. 2, 2016

(54) PACKAGING FOR FINGERPRINT SENSORS AND METHODS OF MANUFACTURE

(75) Inventors: Richard Alexander Erhart, Tempe, AZ (US); Richard Brian Nelson, Chandler, AZ (US)

(73) Assignee: Synaptics Incorporated, San Jose, CA (US)

( * ) Notice: Subject to any disclaimer, the term of this patent is extended or adjusted under 35 U.S.C. 154(b) by 366 days.

(21) Appl. No.: 13/420,188

(22) Filed: Mar. 14, 2012

(65) Prior Publication Data

US 2012/0256280 A1 Oct. 11, 2012

Related U.S. Application Data

(60) Provisional application No. 61/453,460, filed on Mar. 16, 2011.

(51) Int. Cl.
*H01L 33/48* (2010.01)
*H01L 23/31* (2006.01)
(Continued)

(52) U.S. Cl.
CPC .......... *H01L 23/3128* (2013.01); *G06K 9/0002* (2013.01); *G06K 9/00053* (2013.01); *H01L 21/561* (2013.01); *H01L 21/568* (2013.01); *H01L 24/19* (2013.01); *H01L 24/96* (2013.01);
(Continued)

(58) Field of Classification Search
CPC .................. H01L 27/14632; H01L 27/14687; H01L 33/48
USPC ........................................................ 257/660
See application file for complete search history.

(56) References Cited

U.S. PATENT DOCUMENTS

| 671,041 A | 4/1901 | Bailey |
| 4,151,512 A | 4/1979 | Rigannati et al. |

(Continued)

FOREIGN PATENT DOCUMENTS

| CN | 101379510 A | 3/2009 |
| DE | 2213813 A1 | 10/1973 |

(Continued)

OTHER PUBLICATIONS

Matsumoto et al., Impact of Artificial "Gummy" Fingers on Fingerprint Systems, SPIE 4677 (2002), reprinted from cryptome.org.

(Continued)

*Primary Examiner* — Mohammad Choudhry
(74) *Attorney, Agent, or Firm* — Leydig, Voit & Mayer, LTD

(57) ABSTRACT

A fingerprint sensor package, including a sensing side for sensing fingerprint information and a separate connection side for electrically connecting the fingerprint sensor package to a host device, is disclosed. The fingerprint sensor package can also include a sensor integrated circuit facing the sensing side and substantially surrounded by a fill material. The fill material includes vias at peripheral locations around the sensor integrated circuit. The fingerprint sensor package can further include a redistribution layer on the sensing side which redistributes connections of the sensor integrated circuit to the vias. The connections can further be directed through the vias to a ball grid array on the connection side. Some aspects also include electrostatic discharge traces positioned at least partially around a perimeter of the connection side. Methods of manufacturing are also disclosed.

12 Claims, 11 Drawing Sheets

(51) Int. Cl.
  *H01L 21/56* (2006.01)
  *G06K 9/00* (2006.01)
  *H01L 23/00* (2006.01)

(52) U.S. Cl.
  CPC ............. *H01L 2924/10253* (2013.01); *H01L 2924/12041* (2013.01); *H01L 2924/12042* (2013.01)

(56) References Cited

U.S. PATENT DOCUMENTS

| | | |
|---|---|---|
| 4,225,850 A | 9/1980 | Chang et al. |
| 4,310,827 A | 1/1982 | Asi |
| 4,353,056 A | 10/1982 | Tsikos |
| 4,405,829 A | 9/1983 | Rivest et al. |
| 4,525,859 A | 6/1985 | Bowles et al. |
| 4,550,221 A | 10/1985 | Mabusth |
| 4,580,790 A | 4/1986 | Doose |
| 4,758,622 A | 7/1988 | Gosselin |
| 4,817,183 A | 3/1989 | Sparrow |
| 5,076,566 A | 12/1991 | Kriegel |
| 5,109,427 A | 4/1992 | Yang |
| 5,140,642 A | 8/1992 | Hau et al. |
| 5,305,017 A | 4/1994 | Gerpheide |
| 5,319,323 A | 6/1994 | Fong |
| 5,325,442 A | 6/1994 | Knapp |
| 5,420,936 A | 5/1995 | Fitzpatrick et al. |
| 5,422,807 A | 6/1995 | Mitra et al. |
| 5,456,256 A | 10/1995 | Schneider et al. |
| 5,543,591 A | 8/1996 | Gillespie et al. |
| 5,569,901 A | 10/1996 | Bridgelall et al. |
| 5,623,552 A | 4/1997 | Lane |
| 5,627,316 A | 5/1997 | De Winter et al. |
| 5,650,842 A | 7/1997 | Maase et al. |
| 5,717,777 A | 2/1998 | Wong et al. |
| 5,781,651 A | 7/1998 | Hsiao et al. |
| 5,801,681 A | 9/1998 | Sayag |
| 5,818,956 A | 10/1998 | Tuli |
| 5,838,306 A | 11/1998 | O'Connor |
| 5,848,176 A | 12/1998 | Harra et al. |
| 5,850,450 A | 12/1998 | Schweitzer et al. |
| 5,852,670 A | 12/1998 | Setlak et al. |
| 5,864,296 A | 1/1999 | Upton |
| 5,887,343 A | 3/1999 | Salatino et al. |
| 5,892,824 A | 4/1999 | Beatson et al. |
| 5,903,225 A | 5/1999 | Schmitt et al. |
| 5,915,757 A | 6/1999 | Tsuyama et al. |
| 5,920,384 A | 7/1999 | Borza |
| 5,920,640 A | 7/1999 | Salatino et al. |
| 5,940,526 A | 8/1999 | Setlak et al. |
| 5,962,810 A | 10/1999 | Glenn |
| 5,963,679 A | 10/1999 | Setlak |
| 5,999,637 A | 12/1999 | Toyoda et al. |
| 6,002,815 A | 12/1999 | Immega et al. |
| 6,016,355 A | 1/2000 | Dickinson et al. |
| 6,052,475 A | 4/2000 | Upton |
| 6,067,368 A | 5/2000 | Setlak et al. |
| 6,073,343 A | 6/2000 | Petrick et al. |
| 6,076,566 A | 6/2000 | Lowe |
| 6,088,585 A | 7/2000 | Schmitt et al. |
| 6,098,175 A | 8/2000 | Lee |
| 6,118,318 A | 9/2000 | Fifield et al. |
| 6,134,340 A | 10/2000 | Hsu et al. |
| 6,157,722 A | 12/2000 | Lerner et al. |
| 6,161,213 A | 12/2000 | Lofstrom |
| 6,175,407 B1 | 1/2001 | Santor |
| 6,182,076 B1 | 1/2001 | Yu et al. |
| 6,182,892 B1 | 2/2001 | Angelo et al. |
| 6,185,318 B1 | 2/2001 | Jain et al. |
| 6,234,031 B1 | 5/2001 | Suga |
| 6,241,288 B1 | 6/2001 | Bergenek et al. |
| 6,246,566 B1 | 6/2001 | Glenn |
| 6,259,108 B1 | 7/2001 | Antonelli et al. |
| 6,288,346 B1 * | 9/2001 | Ojiri et al. .................. 174/260 |
| 6,289,114 B1 | 9/2001 | Mainguet |
| 6,292,272 B1 | 9/2001 | Okauchi et al. |
| 6,317,508 B1 | 11/2001 | Kramer et al. |
| 6,320,394 B1 | 11/2001 | Tartagni |
| 6,332,193 B1 | 12/2001 | Glass et al. |
| 6,333,989 B1 | 12/2001 | Borza |
| 6,337,919 B1 | 1/2002 | Duton |
| 6,346,739 B1 | 2/2002 | Lepert et al. |
| 6,347,040 B1 | 2/2002 | Fries et al. |
| 6,357,663 B1 | 3/2002 | Takahashi et al. |
| 6,360,004 B1 | 3/2002 | Akizuki |
| 6,362,633 B1 | 3/2002 | Tartagni |
| 6,392,636 B1 | 5/2002 | Ferrari et al. |
| 6,399,994 B2 | 6/2002 | Shobu |
| 6,400,836 B2 | 6/2002 | Senior |
| 6,408,087 B1 | 6/2002 | Kramer |
| 6,473,072 B1 | 10/2002 | Comiskey et al. |
| 6,509,501 B2 | 1/2003 | Eicken et al. |
| 6,525,547 B2 | 2/2003 | Hayes |
| 6,525,932 B1 | 2/2003 | Ohnishi et al. |
| 6,539,101 B1 | 3/2003 | Black |
| 6,580,816 B2 | 6/2003 | Kramer et al. |
| 6,597,289 B2 | 7/2003 | Sabatini |
| 6,631,201 B1 | 10/2003 | Dickinson et al. |
| 6,643,389 B1 | 11/2003 | Raynal et al. |
| 6,672,174 B2 | 1/2004 | Deconde et al. |
| 6,710,416 B1 | 3/2004 | Chou et al. |
| 6,710,461 B2 | 3/2004 | Chou et al. |
| 6,738,050 B2 | 5/2004 | Comiskey et al. |
| 6,741,729 B2 | 5/2004 | Bjorn et al. |
| 6,757,002 B1 | 6/2004 | Oross et al. |
| 6,766,040 B1 | 7/2004 | Catalano et al. |
| 6,785,407 B1 | 8/2004 | Tschudi et al. |
| 6,836,230 B2 | 12/2004 | Le Pailleur et al. |
| 6,838,905 B1 | 1/2005 | Doyle |
| 6,873,356 B1 | 3/2005 | Kanbe et al. |
| 6,876,072 B1 | 4/2005 | Wang et al. |
| 6,886,104 B1 | 4/2005 | McClurg et al. |
| 6,897,002 B2 | 5/2005 | Teraoka et al. |
| 6,898,299 B1 | 5/2005 | Brooks |
| 6,924,496 B2 | 8/2005 | Manansala |
| 6,937,748 B1 | 8/2005 | Schneider et al. |
| 6,941,001 B1 | 9/2005 | Bolle et al. |
| 6,941,810 B2 | 9/2005 | Okada |
| 6,950,540 B2 | 9/2005 | Higuchi |
| 6,959,874 B2 | 11/2005 | Bardwell |
| 6,963,626 B1 | 11/2005 | Shaeffer et al. |
| 6,970,584 B2 | 11/2005 | O'Gorman et al. |
| 6,980,672 B2 | 12/2005 | Saito et al. |
| 6,983,882 B2 | 1/2006 | Cassone |
| 7,013,030 B2 | 3/2006 | Wong et al. |
| 7,015,579 B2 | 3/2006 | Okada et al. |
| 7,020,591 B1 | 3/2006 | Wei et al. |
| 7,030,860 B1 | 4/2006 | Hsu et al. |
| 7,031,670 B2 | 4/2006 | May |
| 7,035,443 B2 | 4/2006 | Wong |
| 7,042,535 B2 | 5/2006 | Katoh et al. |
| 7,043,061 B2 | 5/2006 | Wong |
| 7,043,644 B2 | 5/2006 | DeBruine |
| 7,046,230 B2 | 5/2006 | Zadesky et al. |
| 7,064,743 B2 | 6/2006 | Nishikawa |
| 7,099,496 B2 | 8/2006 | Benkley |
| 7,110,574 B2 | 9/2006 | Haruki et al. |
| 7,110,577 B1 | 9/2006 | Tschud |
| 7,113,622 B2 | 9/2006 | Hamid |
| 7,126,389 B1 | 10/2006 | McRae et al. |
| 7,129,926 B2 | 10/2006 | Mathiassen et al. |
| 7,136,514 B1 | 11/2006 | Wong |
| 7,146,024 B2 | 12/2006 | Benkley |
| 7,146,026 B2 | 12/2006 | Russon et al. |
| 7,146,029 B2 | 12/2006 | Manansala |
| 7,184,581 B2 | 2/2007 | Johansen et al. |
| 7,190,816 B2 | 3/2007 | Mitsuyu et al. |
| 7,194,392 B2 | 3/2007 | Tuken et al. |
| 7,197,168 B2 | 3/2007 | Russo |
| 7,200,250 B2 | 4/2007 | Chou |
| 7,251,351 B2 | 7/2007 | Mathiassen et al. |
| 7,258,279 B2 | 8/2007 | Schneider et al. |
| 7,260,246 B2 | 8/2007 | Fujii |
| 7,263,212 B2 | 8/2007 | Kawabe |

(56) References Cited

U.S. PATENT DOCUMENTS

| | | | |
|---|---|---|---|
| 7,263,213 B2 | 8/2007 | Rowe | |
| 7,289,649 B1 | 10/2007 | Walley et al. | |
| 7,290,323 B2 | 11/2007 | Deconde et al. | |
| 7,308,121 B2 | 12/2007 | Mathiassen et al. | |
| 7,308,122 B2 | 12/2007 | McClurg et al. | |
| 7,321,672 B2 | 1/2008 | Sasaki et al. | |
| 7,356,169 B2 | 4/2008 | Hamid | |
| 7,360,688 B1 | 4/2008 | Harris | |
| 7,369,685 B2 | 5/2008 | DeLeon | |
| 7,379,569 B2 | 5/2008 | Chikazawa et al. | |
| 7,408,135 B2 | 8/2008 | Fujeda | |
| 7,409,876 B2 | 8/2008 | Ganapathi et al. | |
| 7,412,083 B2 | 8/2008 | Takahashi | |
| 7,424,618 B2 | 9/2008 | Roy et al. | |
| 7,447,339 B2 | 11/2008 | Mimura et al. | |
| 7,447,911 B2 | 11/2008 | Chou et al. | |
| 7,460,697 B2 | 12/2008 | Erhart et al. | |
| 7,463,756 B2 | 12/2008 | Benkley | |
| 7,505,611 B2 | 3/2009 | Fyke | |
| 7,505,613 B2 | 3/2009 | Russo | |
| 7,565,548 B2 | 7/2009 | Fiske et al. | |
| 7,574,022 B2 | 8/2009 | Russo | |
| 7,596,832 B2 | 10/2009 | Hsieh et al. | |
| 7,643,950 B1 | 1/2010 | Getzin et al. | |
| 7,646,897 B2 | 1/2010 | Fyke | |
| 7,681,232 B2 | 3/2010 | Nordentoft et al. | |
| 7,689,013 B2 | 3/2010 | Shinzaki | |
| 7,706,581 B2 | 4/2010 | Drews et al. | |
| 7,733,697 B2 | 6/2010 | Picca et al. | |
| 7,751,601 B2 | 7/2010 | Benkley | |
| 7,843,438 B2 | 11/2010 | Onoda | |
| 7,848,798 B2 | 12/2010 | Martinsen et al. | |
| 7,859,116 B1 | 12/2010 | Kelly et al. | |
| 7,899,216 B2 | 3/2011 | Watanabe et al. | |
| 7,953,258 B2 | 5/2011 | Dean et al. | |
| 8,005,276 B2 | 8/2011 | Dean et al. | |
| 8,018,065 B2 | 9/2011 | Lam | |
| 8,031,916 B2 | 10/2011 | Abiko et al. | |
| 8,077,935 B2 | 12/2011 | Geoffroy et al. | |
| 8,107,212 B2 | 1/2012 | Nelson et al. | |
| 8,116,540 B2 | 2/2012 | Dean et al. | |
| 8,131,026 B2 | 3/2012 | Benkley et al. | |
| 8,165,355 B2 | 4/2012 | Benkley et al. | |
| 8,169,070 B2 | 5/2012 | Poeppel et al. | |
| 8,175,345 B2 | 5/2012 | Gardner | |
| 8,204,281 B2 | 6/2012 | Satya et al. | |
| 8,716,613 B2 | 5/2014 | Perezselsky et al. | |
| 8,717,775 B1* | 5/2014 | Bolognia et al. | 361/803 |
| 9,025,301 B1 | 5/2015 | Adlam | |
| 2001/0015431 A1* | 8/2001 | Shobu | 257/1 |
| 2001/0026636 A1 | 10/2001 | Mainget | |
| 2001/0030644 A1 | 10/2001 | Allport | |
| 2001/0036299 A1 | 11/2001 | Senior | |
| 2001/0043728 A1 | 11/2001 | Kramer et al. | |
| 2002/0025062 A1 | 2/2002 | Black | |
| 2002/0061125 A1 | 5/2002 | Fujii | |
| 2002/0064892 A1 | 5/2002 | Lepert et al. | |
| 2002/0067845 A1 | 6/2002 | Griffis | |
| 2002/0073046 A1 | 6/2002 | David | |
| 2002/0089044 A1 | 7/2002 | Simmons et al. | |
| 2002/0089410 A1 | 7/2002 | Janiak et al. | |
| 2002/0096731 A1 | 7/2002 | Wu et al. | |
| 2002/0122026 A1 | 9/2002 | Bergstrom | |
| 2002/0126516 A1 | 9/2002 | Jeon | |
| 2002/0133725 A1 | 9/2002 | Roy et al. | |
| 2002/0152048 A1 | 10/2002 | Hayes | |
| 2002/0181749 A1 | 12/2002 | Matsumoto et al. | |
| 2003/0002717 A1 | 1/2003 | Hamid | |
| 2003/0002719 A1 | 1/2003 | Hamid et al. | |
| 2003/0021495 A1 | 1/2003 | Cheng | |
| 2003/0035570 A1* | 2/2003 | Benkley, III | 382/124 |
| 2003/0063782 A1 | 4/2003 | Acharya et al. | |
| 2003/0068072 A1 | 4/2003 | Hamid | |
| 2003/0076301 A1 | 4/2003 | Tsuk et al. | |
| 2003/0076303 A1 | 4/2003 | Huppi | |
| 2003/0095096 A1 | 5/2003 | Robbin et al. | |
| 2003/0095690 A1 | 5/2003 | Su et al. | |
| 2003/0102874 A1 | 6/2003 | Lane et al. | |
| 2003/0123714 A1 | 7/2003 | O'Gorman et al. | |
| 2003/0123715 A1 | 7/2003 | Uchida | |
| 2003/0141959 A1 | 7/2003 | Keogh et al. | |
| 2003/0147015 A1 | 8/2003 | Katoh et al. | |
| 2003/0161510 A1 | 8/2003 | Fuji | |
| 2003/0161512 A1 | 8/2003 | Mathiassen et al. | |
| 2003/0169228 A1 | 9/2003 | Mathiassen et al. | |
| 2003/0174871 A1 | 9/2003 | Yoshioka et al. | |
| 2003/0186157 A1 | 10/2003 | Teraoka et al. | |
| 2003/0209293 A1 | 11/2003 | Sako et al. | |
| 2003/0224553 A1 | 12/2003 | Manansala | |
| 2003/0227094 A1 | 12/2003 | Chou et al. | |
| 2004/0012773 A1 | 1/2004 | Puttkammer | |
| 2004/0017934 A1 | 1/2004 | Kocher et al. | |
| 2004/0022001 A1 | 2/2004 | Chu et al. | |
| 2004/0042642 A1 | 3/2004 | Bolle et al. | |
| 2004/0050930 A1 | 3/2004 | Rowe | |
| 2004/0066613 A1 | 4/2004 | Leitao | |
| 2004/0076313 A1 | 4/2004 | Bronstein et al. | |
| 2004/0081339 A1 | 4/2004 | Benkley | |
| 2004/0096086 A1 | 5/2004 | Miyasaka | |
| 2004/0113956 A1 | 6/2004 | Bellwood et al. | |
| 2004/0120400 A1 | 6/2004 | Linzer | |
| 2004/0125993 A1 | 7/2004 | Zhao et al. | |
| 2004/0129787 A1 | 7/2004 | Saito | |
| 2004/0136612 A1 | 7/2004 | Meister et al. | |
| 2004/0155752 A1 | 8/2004 | Radke | |
| 2004/0172339 A1 | 9/2004 | Snelgrove et al. | |
| 2004/0179718 A1 | 9/2004 | Chou | |
| 2004/0184641 A1 | 9/2004 | Nagasaka et al. | |
| 2004/0188838 A1 | 9/2004 | Okada et al. | |
| 2004/0190761 A1 | 9/2004 | Lee | |
| 2004/0208346 A1 | 10/2004 | Baharav et al. | |
| 2004/0208347 A1 | 10/2004 | Baharav et al. | |
| 2004/0208348 A1 | 10/2004 | Baharav et al. | |
| 2004/0213441 A1 | 10/2004 | Tschudi | |
| 2004/0215689 A1 | 10/2004 | Dooley et al. | |
| 2004/0228505 A1 | 11/2004 | Sugimoto | |
| 2004/0228508 A1 | 11/2004 | Shigeta | |
| 2004/0240712 A1 | 12/2004 | Rowe et al. | |
| 2004/0252867 A1 | 12/2004 | Lan et al. | |
| 2005/0031174 A1* | 2/2005 | Ryhanen et al. | 382/124 |
| 2005/0036665 A1 | 2/2005 | Higuchi | |
| 2005/0047485 A1 | 3/2005 | Khayrallah et al. | |
| 2005/0100196 A1 | 5/2005 | Scott et al. | |
| 2005/0100938 A1 | 5/2005 | Hoffmann et al. | |
| 2005/0109835 A1 | 5/2005 | Jacoby et al. | |
| 2005/0110103 A1 | 5/2005 | Setlak | |
| 2005/0111708 A1 | 5/2005 | Chou | |
| 2005/0123176 A1 | 6/2005 | Ishii et al. | |
| 2005/0129291 A1 | 6/2005 | Boshra | |
| 2005/0136200 A1 | 6/2005 | Durell et al. | |
| 2005/0139656 A1 | 6/2005 | Arnouse | |
| 2005/0139685 A1 | 6/2005 | Kozlay | |
| 2005/0162402 A1 | 7/2005 | Watanachote | |
| 2005/0169503 A1 | 8/2005 | Howell et al. | |
| 2005/0174015 A1 | 8/2005 | Scott et al. | |
| 2005/0210271 A1 | 9/2005 | Chou et al. | |
| 2005/0219200 A1 | 10/2005 | Weng | |
| 2005/0220329 A1 | 10/2005 | Payne et al. | |
| 2005/0231213 A1 | 10/2005 | Chou et al. | |
| 2005/0238212 A1 | 10/2005 | Du et al. | |
| 2005/0244038 A1 | 11/2005 | Benkley | |
| 2005/0244039 A1 | 11/2005 | Geoffroy et al. | |
| 2005/0247559 A1 | 11/2005 | Frey et al. | |
| 2005/0249386 A1 | 11/2005 | Juh | |
| 2005/0258952 A1 | 11/2005 | Utter et al. | |
| 2005/0269402 A1 | 12/2005 | Spitzer et al. | |
| 2006/0006224 A1 | 1/2006 | Modi | |
| 2006/0055500 A1 | 3/2006 | Burke et al. | |
| 2006/0066572 A1 | 3/2006 | Yumoto et al. | |
| 2006/0078176 A1 | 4/2006 | Abiko et al. | |
| 2006/0083411 A1 | 4/2006 | Benkley | |
| 2006/0110537 A1 | 5/2006 | Huang et al. | |
| 2006/0140461 A1 | 6/2006 | Kim et al. | |
| 2006/0144953 A1 | 7/2006 | Takao | |

(56) References Cited

U.S. PATENT DOCUMENTS

| | | |
|---|---|---|
| 2006/0170528 A1 | 8/2006 | Funushige et al. |
| 2006/0187200 A1 | 8/2006 | Martin |
| 2006/0210082 A1 | 9/2006 | Devadas et al. |
| 2006/0214512 A1 | 9/2006 | Iwata |
| 2006/0239514 A1 | 10/2006 | Watanabe et al. |
| 2006/0249008 A1 | 11/2006 | Luther |
| 2006/0259873 A1 | 11/2006 | Mister |
| 2006/0261174 A1 | 11/2006 | Zellner et al. |
| 2006/0267125 A1 | 11/2006 | Huang et al. |
| 2006/0267385 A1 | 11/2006 | Steenwyk et al. |
| 2006/0271793 A1 | 11/2006 | Devadas et al. |
| 2006/0287963 A1 | 12/2006 | Steeves et al. |
| 2007/0031011 A1 | 2/2007 | Erhart et al. |
| 2007/0036400 A1 | 2/2007 | Watanabe et al. |
| 2007/0057763 A1 | 3/2007 | Blattner et al. |
| 2007/0067828 A1 | 3/2007 | Bychkov |
| 2007/0076926 A1 | 4/2007 | Schneider et al. |
| 2007/0076951 A1 | 4/2007 | Tanaka et al. |
| 2007/0086634 A1 | 4/2007 | Setlak et al. |
| 2007/0090312 A1 | 4/2007 | Stallinga et al. |
| 2007/0138299 A1 | 6/2007 | Mitra |
| 2007/0160269 A1 | 7/2007 | Kuo |
| 2007/0180261 A1 | 8/2007 | Akkermans et al. |
| 2007/0196002 A1 | 8/2007 | Choi et al. |
| 2007/0198141 A1 | 8/2007 | Moore |
| 2007/0198435 A1 | 8/2007 | Siegal et al. |
| 2007/0228154 A1 | 10/2007 | Tran |
| 2007/0237366 A1 | 10/2007 | Maletsky |
| 2007/0248249 A1 | 10/2007 | Stoianov |
| 2008/0002867 A1 | 1/2008 | Mathiassen et al. |
| 2008/0013805 A1 | 1/2008 | Sengupta et al. |
| 2008/0019578 A1 | 1/2008 | Saito et al. |
| 2008/0049987 A1 | 2/2008 | Champagne et al. |
| 2008/0049989 A1 | 2/2008 | Iseri et al. |
| 2008/0063245 A1 | 3/2008 | Benkley et al. |
| 2008/0069412 A1 | 3/2008 | Champagne et al. |
| 2008/0126260 A1 | 5/2008 | Cox et al. |
| 2008/0169345 A1 | 7/2008 | Keane et al. |
| 2008/0170695 A1 | 7/2008 | Adler et al. |
| 2008/0175450 A1 | 7/2008 | Scott et al. |
| 2008/0178008 A1 | 7/2008 | Takahashi et al. |
| 2008/0179112 A1 | 7/2008 | Qin et al. |
| 2008/0185429 A1 | 8/2008 | Saville |
| 2008/0201265 A1 | 8/2008 | Hewton |
| 2008/0205714 A1 | 8/2008 | Benkley et al. |
| 2008/0219521 A1 | 9/2008 | Benkley et al. |
| 2008/0222049 A1 | 9/2008 | Loomis et al. |
| 2008/0223925 A1 | 9/2008 | Saito et al. |
| 2008/0226132 A1 | 9/2008 | Gardner |
| 2008/0240523 A1 | 10/2008 | Benkley et al. |
| 2008/0244277 A1 | 10/2008 | Orsini et al. |
| 2008/0267462 A1 | 10/2008 | Nelson et al. |
| 2008/0279373 A1 | 11/2008 | Erhart et al. |
| 2008/0308917 A1 | 12/2008 | Pressel et al. |
| 2008/0308924 A1 | 12/2008 | Szewerenko et al. |
| 2009/0130369 A1 | 5/2009 | Huang et al. |
| 2009/0153297 A1 | 6/2009 | Gardner |
| 2009/0154779 A1 | 6/2009 | Satyan et al. |
| 2009/0155456 A1 | 6/2009 | Benkley et al. |
| 2009/0169071 A1 | 7/2009 | Bond et al. |
| 2009/0174974 A1 | 7/2009 | Huang et al. |
| 2009/0218698 A1 | 9/2009 | Lam |
| 2009/0237135 A1 | 9/2009 | Ramaraju et al. |
| 2009/0252384 A1 | 10/2009 | Dean et al. |
| 2009/0252385 A1 | 10/2009 | Dean et al. |
| 2009/0252386 A1 | 10/2009 | Dean et al. |
| 2009/0279742 A1 | 11/2009 | Abiko |
| 2009/0319435 A1 | 12/2009 | Little et al. |
| 2009/0324028 A1 | 12/2009 | Russo |
| 2010/0013091 A1 | 1/2010 | Meyer et al. |
| 2010/0026451 A1 | 2/2010 | Erhart et al. |
| 2010/0045705 A1 | 2/2010 | Vertegaal et al. |
| 2010/0083000 A1 | 4/2010 | Kesanupalli et al. |
| 2010/0119124 A1 | 5/2010 | Satyan |
| 2010/0123657 A1 | 5/2010 | Ippel |
| 2010/0127366 A1 | 5/2010 | Bond et al. |
| 2010/0148360 A1* | 6/2010 | Lin et al. ............ 257/737 |
| 2010/0176823 A1 | 7/2010 | Thompson et al. |
| 2010/0176892 A1 | 7/2010 | Thompson et al. |
| 2010/0177940 A1 | 7/2010 | Thompson et al. |
| 2010/0180136 A1 | 7/2010 | Thompson et al. |
| 2010/0189314 A1 | 7/2010 | Benkley et al. |
| 2010/0208953 A1 | 8/2010 | Gardner et al. |
| 2010/0244166 A1 | 9/2010 | Shibuta et al. |
| 2010/0272329 A1 | 10/2010 | Benkley |
| 2010/0284565 A1 | 11/2010 | Benkley et al. |
| 2011/0002461 A1 | 1/2011 | Erhart et al. |
| 2011/0018556 A1 | 1/2011 | Le et al. |
| 2011/0079903 A1 | 4/2011 | Liu |
| 2011/0090047 A1 | 4/2011 | Patel |
| 2011/0102567 A1 | 5/2011 | Erhart |
| 2011/0102569 A1 | 5/2011 | Erhart |
| 2011/0157853 A1 | 6/2011 | Goh |
| 2011/0175703 A1 | 7/2011 | Benkley |
| 2011/0176307 A1 | 7/2011 | Benkley |
| 2011/0182486 A1 | 7/2011 | Valfridsson et al. |
| 2011/0214924 A1 | 9/2011 | Perezselsky et al. |
| 2011/0267298 A1 | 11/2011 | Erhart et al. |
| 2011/0298711 A1 | 12/2011 | Dean et al. |
| 2011/0304001 A1 | 12/2011 | Erhart et al. |
| 2012/0044639 A1 | 2/2012 | Garcia |
| 2012/0256280 A1 | 10/2012 | Ehart |

FOREIGN PATENT DOCUMENTS

| | | |
|---|---|---|
| DE | 102012005926 A1 | 9/2013 |
| EP | 0929028 A2 | 1/1998 |
| EP | 0905646 A1 | 3/1999 |
| EP | 0973123 A1 | 1/2000 |
| EP | 1018697 A2 | 7/2000 |
| EP | 1139301 A2 | 10/2001 |
| EP | 1531419 A2 | 5/2005 |
| EP | 1533759 A1 | 5/2005 |
| EP | 1538548 A2 | 6/2005 |
| EP | 1624399 B1 | 2/2006 |
| EP | 1775674 A2 | 4/2007 |
| EP | 1939788 A1 | 7/2008 |
| GB | 2331613 A | 5/1999 |
| GB | 2480919 | 12/2011 |
| JP | 01094418 A2 | 4/1989 |
| JP | 04158434 A2 | 6/1992 |
| JP | 2005011002 A | 1/2005 |
| JP | 2005242856 | 9/2005 |
| TW | 200606745 A | 2/2006 |
| TW | 200620140 A | 6/2006 |
| TW | 200629167 A | 8/2006 |
| TW | 201011840 A | 3/2010 |
| WO | WO 90/03620 A1 | 4/1990 |
| WO | WO 98/58342 A1 | 12/1998 |
| WO | WO 99/28701 A1 | 6/1999 |
| WO | WO 99/43258 A1 | 9/1999 |
| WO | WO 01/22349 A1 | 3/2001 |
| WO | WO 01/94902 A2 | 12/2001 |
| WO | WO 01/94902 A3 | 12/2001 |
| WO | WO 01/95304 A1 | 12/2001 |
| WO | WO 02/11066 A1 | 2/2002 |
| WO | WO 02/47018 A2 | 6/2002 |
| WO | WO 02/47018 A3 | 6/2002 |
| WO | WO 02/061668 A1 | 8/2002 |
| WO | WO 02/077907 A1 | 10/2002 |
| WO | WO 03/063054 A2 | 7/2003 |
| WO | WO 03/075210 A2 | 9/2003 |
| WO | WO 2004/066194 A1 | 8/2004 |
| WO | WO 2004/066693 A1 | 8/2004 |
| WO | WO 2005/104012 A1 | 11/2005 |
| WO | WO 2005/106774 A2 | 11/2005 |
| WO | WO 2005/106774 A3 | 11/2005 |
| WO | WO 2006/040724 | 4/2006 |
| WO | WO 2006/041780 A1 | 4/2006 |
| WO | WO 2007/011607 A1 | 1/2007 |
| WO | WO 2008/033264 A2 | 3/2008 |
| WO | WO 2008/033264 A3 | 3/2008 |
| WO | WO 2008/033265 A2 | 6/2008 |
| WO | WO 2008/033265 A3 | 6/2008 |

(56) References Cited

FOREIGN PATENT DOCUMENTS

| WO | WO 2008/137287 A1 | 11/2008 |
|---|---|---|
| WO | WO 2009/002599 A2 | 12/2008 |
| WO | WO 2009/002599 A3 | 12/2008 |
| WO | WO 2009/029257 A1 | 6/2009 |
| WO | WO 2009/079219 A1 | 6/2009 |
| WO | WO 2009/079221 A2 | 6/2009 |
| WO | WO 2009/079257 A1 | 6/2009 |
| WO | WO 2009/079262 A1 | 6/2009 |
| WO | WO 2010/034036 A1 | 3/2010 |
| WO | WO 2010/036445 A1 | 4/2010 |
| WO | WO 2010/143597 A1 | 12/2010 |
| WO | WO 2011/088248 A1 | 1/2011 |
| WO | WO/2011/088252 A1 | 1/2011 |
| WO | WO 2011/053797 A1 | 5/2011 |

OTHER PUBLICATIONS

Maltoni, "Handbook of Fingerprint Recognition", XP002355942 Springer, New York, USA, Jun. 2003 pp. 65-69.

Vermasan, et al., "A500 dpi AC Capacitive Hybrid Flip-Chip CMOS ASIC/Sensor Module for Fingerprint, Navigation, and Pointer Detection With On-Chip Data Processing", IEEE Journal of Solid State Circuits, vol. 38, No. 12, Dec. 2003, pp. 2288-2294.

Ratha, et al. "Adaptive Flow Orientation Based Feature Extraction in Fingerprint Images," Pattern Recognition, vol. 28 No. 11, 1657-1672, Nov. 1995.

Ratha, et al., "A Real Time Matching System for Large Fingerprint Databases," IEEE, Aug. 1996.

Suh, et al., "Design and Implementation of the AEGIS Single-Chip Secure Processor Using Physical Random Functions", Computer Architecture, 2005, ISCA '05, Proceedings, 32nd International Symposium, Jun. 2005 (MIT Technical Report CSAIL CSG-TR-843, 2004.

Rivest, et al., "A Method for Obtaining Digital Signatures and Public-Key Cryptosystems", Communication of the ACM, vol. 21 (2), pp. 120-126. (1978).

Hiltgen, et al., "Secure Internet Banking Authentication", IEEE Security and Privacy, IEEE Computer Society, New York, NY, US, Mar. 1, 2006, pp. 24-31, XP007908655, ISSN: 1540-7993.

Hegt, "Analysis of Current and Future Phishing Attacks on Internet Banking Services", Mater Thesis. Techische Universiteit Eindhoven—Department of Mathematics and Computer Science May 31, 2008, pp. 1-149, XP002630374, Retrieved from the Internet: URL:http://alexandria.tue.nl/extral/afstversl/wsk-i/hgt2008.pdf [retrieved on Mar. 29, 2011] *pp. 127-134, paragraph 6.2*.

Gassend, et al., "Controlled Physical Random Functions", In Proceedings of the 18th Annual Computer Security Conference, Las Vegas, Nevada, Dec. 12, 2002.

Wikipedia (Mar. 2003). "Integrated Circuit," http://en.wikipedia.org/wiki/integrated_circuit. Revision as of Mar. 23, 2003.

Wikipedia (Dec. 2006). "Integrated circuit" Revision as of Dec. 10, 2006. http://en.widipedia.org/wiki/Integrated_circuit.

bellagiodesigns.com (Internet Archive Wayback Machine, www.bellagiodesigns.com date: Oct. 29, 2005).

Closed Loop Systems, The Free Dictionary, http://www.thefreedictionary.com/closed-loop+system (downloaded Dec. 1, 2011).

Feedback: Electronic Engineering, Wikipedia, p. 5 http://en.wikipedia.org/wiki/Feedback#Electronic_engineering (downloaded Dec. 1, 2011).

Galy et al. (Jul. 2007) "A full fingerprint verification system for a single-line sweep sensor." IEEE Sensors J., vol. 7 No. 7, pp. 1054-1065.

Kim, et al. "Application of Through Mold Via (TMV) as PoP Base Package," 2008 Electronic Components and Technology Conference IEEE (2008).

Meyer, et al., "System Integration with eWLB", IEEE Electronic System—Integration Technology Conference (ESTC 2010), Berlin, Sep. 3, 2010.

Taiwan Intellectual Property Office, Notice of Examination Opinion in Taiwanese Patent Application No. 101108816 (Sep. 25, 2015).

Complaint with Exhibits, *Amkor Technology, Inc. v. Synaptics Incorporated and Validity Sensors, LLC*, District of Delaware, 1:15-cv-00910-GMS, Oct. 9, 2015.

Synaptics Incorporated's Motion to Dismiss, *Amkor Technology, Inc. v. Synaptics Incorporated and Validity Sensors, LLC*, District of Delaware, 1:15-cv-00910-GMS, Dec. 18, 2015.

Validity Sensors, LLC's Motion to Dismiss, *Amkor Technology, Inc. v. Synaptics Incorporated and Validity Sensors, LLC*, District of Delaware, 1:15-cv-00910-GMS, Dec. 18, 2015.

Synaptics Incorporated's Brief in Support of its Motion to Dismiss, *Amkor Technology, Inc. v. Synaptics Incorporated and Validity Sensors, LLC*, District of Delaware, 1:15-cv-00910-GMS, Dec. 18, 2015.

Validity Sensors, LLC's Brief in Support of its Motion to Dismiss, *Amkor Technology, Inc. v. Synaptics Incorporated and Validity Sensors, LLC*, District of Delaware, 1:15-cv-00910-GMS, Dec. 18, 2015.

\* cited by examiner

PACKAGING FOR FINGERPRINT SENSORS AND METHODS OF MANUFACTURE

RELATED CASES

This Application claims priority to U.S. Provisional Application 61/453,460, entitled PACKAGING FOR FINGERPRINT SENSORS AND METHODS OF MANUFACTURE, filed on Mar. 16, 2011, the disclosure of which is hereby incorporated by reference in its entirety for all purposes, as if the entire disclosure, specification and drawings, were completely reproduced in this application.

BACKGROUND OF THE DISCLOSED SUBJECT MATTER

Conventional fingerprint sensors include an integrated circuit, such as a silicon die, with an exposed top surface portion for receiving human touch. Due to the exposed top surface, packaging of the integrated circuit can be difficult. For example, conventional packages encapsulate the integrated circuit while exposing a portion of the top surface, but must provide room for wire connections from the top surface to peripheral connection points on a substrate below the integrated circuit. The substrate is provided with additional connection points in order to allow connection of the fingerprint sensor package to a host device. See, U.S. Pat. No. 7,251,351 issued Jul. 31, 2007, to Mathiassen et al. for Sensor Unit, Especially for Fingerprint Sensors; U.S. Pat. No. 6,710,41 issued Mar. 23, 2004, to Chou et al. for Wafer Level Packing of Micro Electromechanical Device.

Some fingerprint sensors provide the silicon die attached to an underside of a flexible substrate, where human touch over the top of the flexible substrate can be sensed indirectly by the silicon die, as discussed in U.S. Pat. No. 7,099,496, issued to Benkley, on Aug. 29, 2006, entitled SWIPED APERTURE CAPACITIVE FINGERPRINT SENSING SYSTEMS AND METHODS, and U.S. Pat. No. 7,751,601, issued on Jul. 6, 2010, to Benkley, entitled FINGER SENSING ASSEMBLIES AND METHODS OF MAKING, both of which are assigned to the assignee of the present application and incorporated by reference. In such fingerprint sensors, the silicon die is either attached directly under the surface to be touched for sensing through the flexible substrate, or attached remote from the surface to be touched and a separate array of metal traces in communication with the silicone die is located directly under the surface to be touched for sensing through the flexible substrate. Rigid substrates or rigid bases must be coupled to the flexible substrate or positioned under the flexible substrate to provide support for the flexible substrate and/or the silicon die when connected to a host device.

Kim et al., "Application of Through Mold Via (TMV) as PoP Base Package," 2008 Electronic Components and Technology Conference, IEEE (2008) discusses the application of through mold vias ("TMV") in a "fan-out" wafer level packaging ("WLFO package") arrangement for a package on package ("PoP") device. The disclosure of Kim et al. is incorporated by reference.

SUMMARY

An aspect of the disclosed subject matter provides a fingerprint sensor package including a sensing side for sensing fingerprint information and a separate connection side for electrically connecting the fingerprint sensor package to a host device. The fingerprint sensor package can also be adapted and configured to include a sensor integrated circuit facing the sensing side and substantially surrounded by a fill material. Additionally, the fill material can include vias at peripheral locations around the sensor integrated circuit. The fingerprint sensor package can further be adapted and configured to include a redistribution layer on the sensing side which redistributes connections of the sensor integrated circuit to the vias. The connections can further be directed through the vias to a ball grid array on a connection side. Some aspects also include electrostatic discharge traces positioned at least partially around a perimeter of the connection side.

Another aspect of the disclosure provides for the fabrication of the sensors.

INCORPORATION BY REFERENCE

All publications, patents, and patent applications mentioned in this specification are herein incorporated by reference to the same extent as if each individual publication, patent, or patent application was specifically and individually indicated to be incorporated by reference, for all possible purposes and to the same extent as if the disclosure of which was reproduced in the present application in its entirety.

BRIEF DESCRIPTION OF THE DRAWINGS

The novel features of the disclosed subject matter are set forth with particularity in the appended claims. A better understanding of the features and advantages of the present disclosed subject matter will be obtained by reference to the following detailed description that sets forth illustrative embodiments, in which the principles of the disclosed subject matter are utilized, and the accompanying drawings of which:

DETAILED DESCRIPTION

Figure 1:
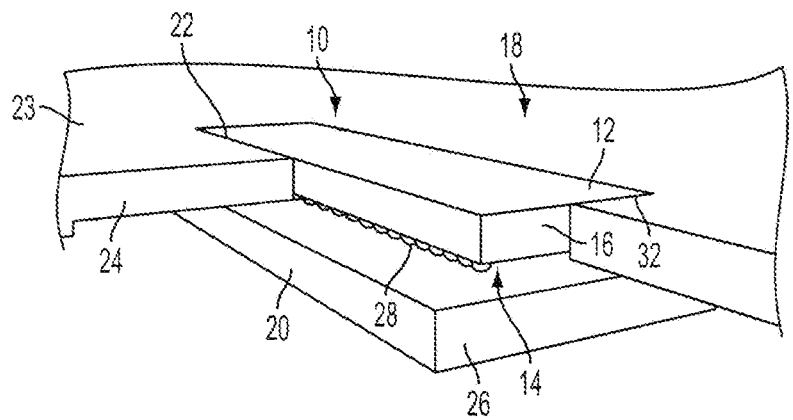
FIG. 1 is a perspective view of a fingerprint sensor package incorporated into a host device with a flush configuration.

The following discussion is presented to enable a person skilled in the art to make and use embodiments of the disclosed subject matter. Various modifications to the illustrated embodiments will be readily apparent to those skilled in the art, and the generic principles herein can be applied to other embodiments and applications without departing from embodiments of the disclosed subject matter. Thus, embodiments of the disclosed subject matter are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the disclosed subject matter. Skilled artisans will recognize the examples provided herein have many useful alternatives which fall within the scope of embodiments of the disclosed subject matter and/or the appended claims.

Figure 2:
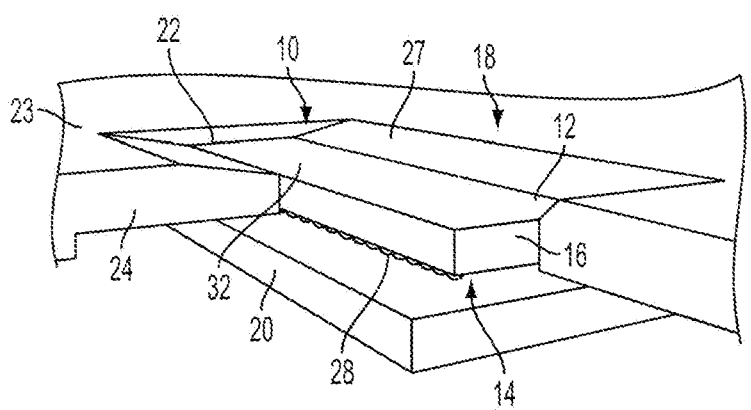
FIG. 2 is another perspective view of a fingerprint sensor package incorporated into a host device with a beveled configuration.

FIGS. 1 and 2 illustrate a package 10 for a biometric object sensor, e.g., a fingerprint sensor package 10, according to aspects of the disclosed subject matter. The fingerprint sensor package 10 can include a sensing side 12, a connection side 14, and a mold filler material 16 between the sensing side 12 and the connection side 14. As shown in FIGS. 1 and 2, the fingerprint sensor package 10 can be incorporated into a separate product or device 18 (e.g., a host device). For example, the connection side 14 can be electrically coupled to a substrate 20 of the device 18 and the sensing side 12 can be exposed through a cutout 22 in a device housing 24 of the device 18. In one aspect, the sensing side 12 can be flush with an outer surface 23 of the device housing 24, as shown in FIG. 1. In another aspect, the device housing 24 can be beveled, i.e., formed with bevels 27 around the cutout 22 so that the sensing side 12 can be substantially below the outer surface 23, as shown in FIG. 2.

Figure 3:
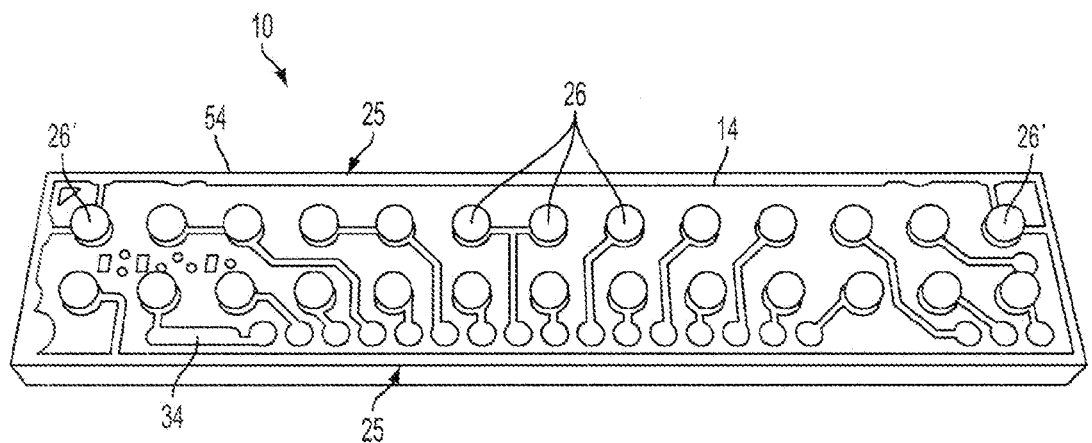
FIG. 3 is a top perspective view of a connection side of the fingerprint sensor package of FIG. 1.
Figure 4:
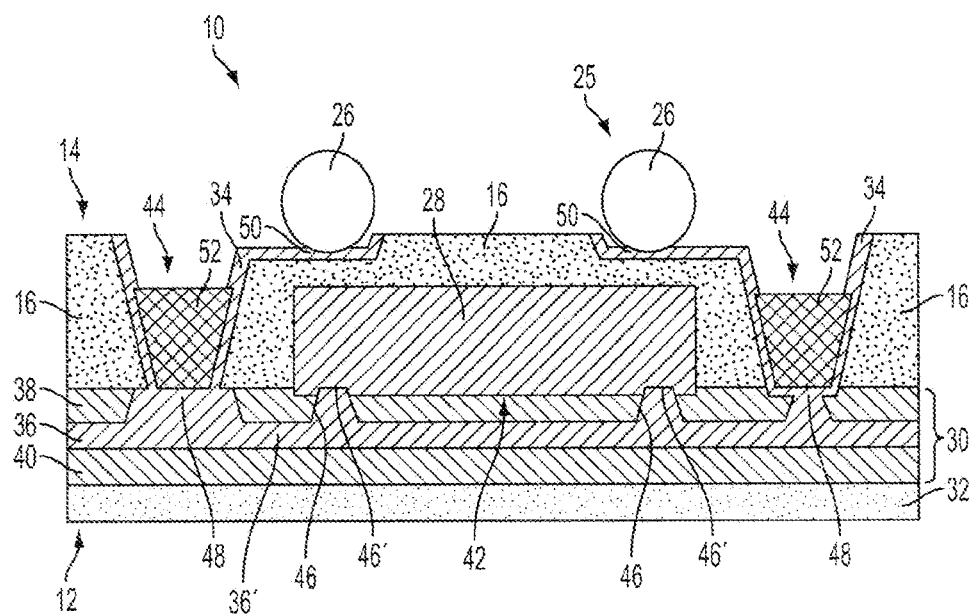
FIG. 4 is a cross-sectional view of the fingerprint sensor package of FIG. 1.
Figure 5:
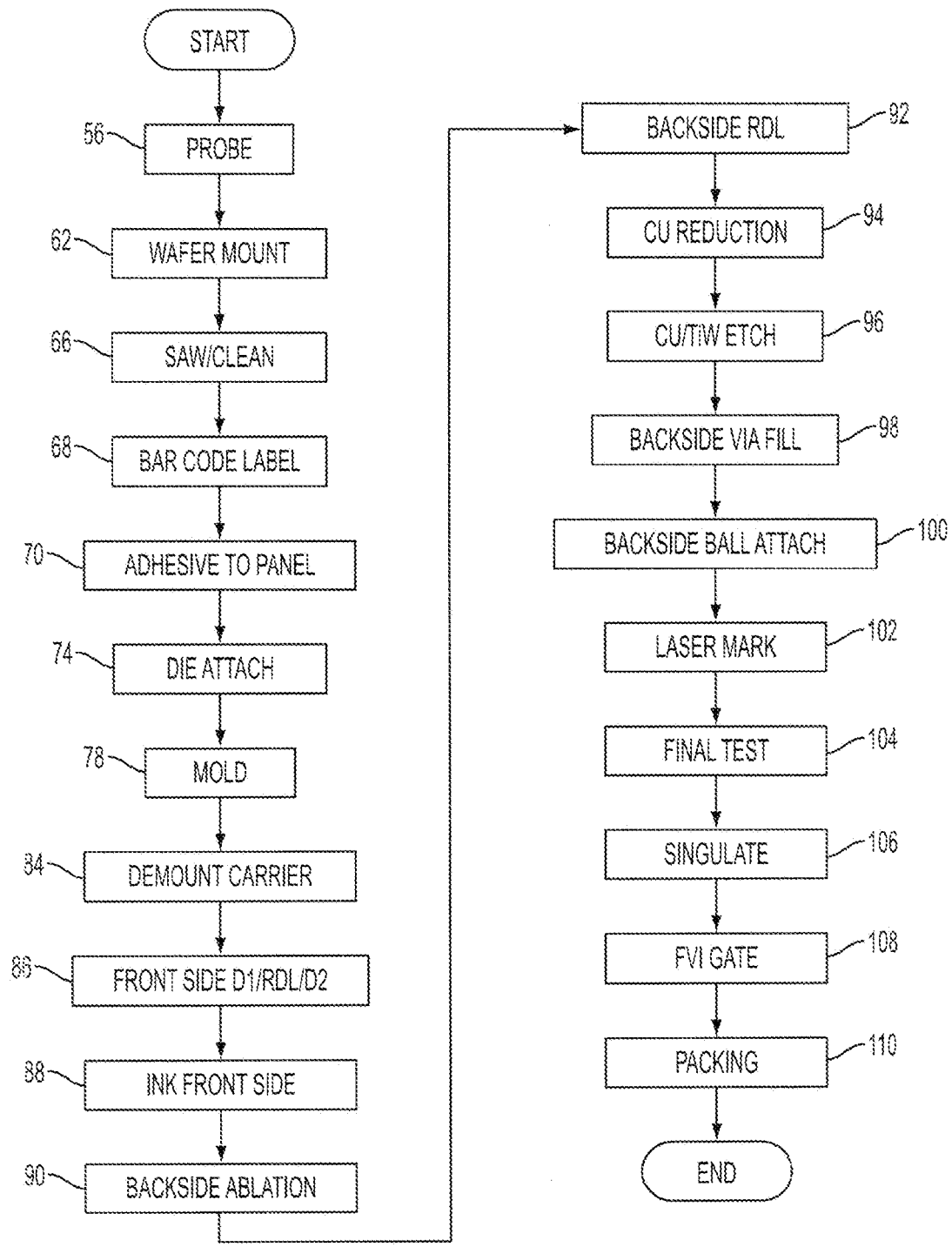
FIG. 5 is a flow chart of a process for fabricating fingerprint sensor packages.

As shown in FIGS. 1-3, the connection side 14 can include a ball grid array ("BGA") 25, comprising a plurality of solder balls 26 to electrically couple the connection side 14 to the device substrate 20. In addition, as shown in FIG. 4, the fingerprint sensor package 10 can include a sensor integrated circuit 28, a sensing side redistribution layer 30, a sensing side coating or ink layer 32, and a connection side redistribution layer 34.

In at least some aspects, the sensing side redistribution layer 30 can include a metal layer 36 with metal redistribution traces 36', a metal sensor array (not shown), and, optionally, additional metal traces (not shown). The metal layer 36 can be positioned between a first passivation layer 38 and a second passivation layer 40, as shown in FIG. 4. The sensor array (not shown) can include a plurality of conductive traces (not shown), such as copper traces, for providing image sensing to detect the ridges and valleys of a fingerprint as a finger moves across the sensing side 12 and/or velocity sensing to detect the speed of a finger moving across the sensing side 12, as is shown by way of example in the Benkley references cited above.

Fingerprint information sensed by the sensor array (not shown) can be transmitted to the sensor integrated circuit 28 via wireless or wired communication technologies. For example, in one aspect, a circuit side 42 of the sensor integrated circuit 28 (e.g., the side facing the sensing side 12) can include a radio frequency receiver (not shown) and each trace of the sensor array (not shown) can include a radio frequency transmitter (not shown) for transmitting the sensed fingerprint information to the radio frequency receiver (not shown). In other aspects, the sensor integrated circuit 28 can include a plurality of radiofrequency receivers (not shown), e.g., formed on the sensor side 42 of the integrated circuit 28, for receiving information transmitted from one or more of the radio frequency transmitter traces (not shown) of the sensor array (not shown), e.g., also formed on the sensor side 42 of the integrated circuit 28. The sensor integrated circuit 28 can also include drive and sense electronics for interpreting the fingerprint information received. In addition, the sensing side coating layer 32 can provide substantial protection against mechanical abrasion and/or mechanical wear of the sensor integrated circuit 28 and the sensing side redistribution layer 30, while such traces as may be formed on the sensor side 42 of the integrated circuit 28 can be similarly protected by layers 30 and 32.

In other aspects, the circuitry on the sensor side 42 of the sensor integrated circuit 28 can include an embedded pixel array (not shown) for directly sensing fingerprint information. In one example, the embedded pixel array (not shown) can sense fingerprint information through the sensing side redistribution layer 30 and/or the sensing side coating layer 32. In another example, the embedded pixel array (not shown) can be substantially exposed on the sensing side 12 so that the finger directly touches the sensor integrated circuit 28 for sensing, e.g., through an opening formed in the layers 30 and 32. The sensor integrated circuit 28 can also include the drive and sense electronics for interpreting the fingerprint information sensed by the pixel array (not shown).

The mold filler 16 can provide the fingerprint sensor package 10 with substantial strength and durability, and can substantially protect the sensor integrated circuit 28 from physical damage. As shown in FIG. 4, the mold filler 16 can include through-mold vias ("TMVs") 44 which extend through the mold filler 16. The TMV vias 44 can allow connection between the sensing side redistribution layer 30 and the connection side redistribution layer 34. More specifically, the sensing side redistribution layer 30 can have redistribution connections 46 from the sensor/circuit side 42 of the sensor integrated circuit 28, such as bond pad connections 46', also shown in an embodiment of FIG. 18, to peripheral connection locations 48 at the vias 44. The connection side redistribution layer 34 can redistribute from the connection locations 48, through the TMV vias 44, to BGA 25 individual solder balls 26, e.g., attached at connection points 50. As a result, the connections 46 from the sensor integrated circuit 28 can be electrically routed to the BOA 25 solder ball connectors 26 on the connection side 14 by the redistribution layers 30, 34. Fingerprint information received and interpreted by the sensor integrated circuit 28 can then be communicated to the device 18 through the BGA 25 to the device substrate 20 (shown in FIG. 1 by way of example). In conventional fingerprint sensor packages, encapsulated wire bonds (not shown) can be routed from a sensing side 12 around the sensor integrated circuit 28 to a connection side 14. In some aspects, the TMV vias 44 replace encapsulated wire bond connections (not shown), which can substantially decrease the thickness and/or area of the fingerprint sensor package 10 compared to conventional fingerprint sensor packages. Also, as shown in FIG. 4, the TMV vias 44 can be filled with a filler material 52, for example, to add further structural strength and rigidity to the package 10.

Conventional electronic components, such as integrated circuits 28 in fingerprint sensor packages 10, can be exposed to electrostatic discharge (ESD) from various different sources, such as the human body (e.g., during a finger swipe). Contact between the sources and a grounded integrated circuit can generate large enough currents through the integrated circuit to cause significant damage. As shown in FIG. 3, the fingerprint sensor package 10 can include ESD discharge traces 54 etched or otherwise formed, as described below, at least partially around a perimeter of the connection side 14. The ESD discharge traces 54 can be connected to a known potential, such as ground. For example, as shown in FIG. 3, the ESD discharge traces 54 can be connected to respective solder balls 26' in the BGA 25 for connection to a known potential through the substrate 20 of the host product or device 18.

ESD can build up on the sensing side 12 as a user swipes his or her finger. This charge can continue to increase in potential until the path of least resistance is found and the charge is dissipated. The ESD discharge traces 54 can create the shortest discharge path for ESD, thus preventing ESD from discharging to the sensor integrated circuit 28 or any other components of the fingerprint sensing package 10 and potentially damaging them. In some aspects, the ESD discharge traces 54 can completely surround the outside perimeter of the connection side 14. In other aspects, the ESD discharge traces 54 can partially surround the outside perimeter of the connection side 14. Also, in some aspects, the ESD discharge traces 54 can be positioned on the sensing side 12 to completely or at least partially surround the sensor array (not shown).

Figure 6:
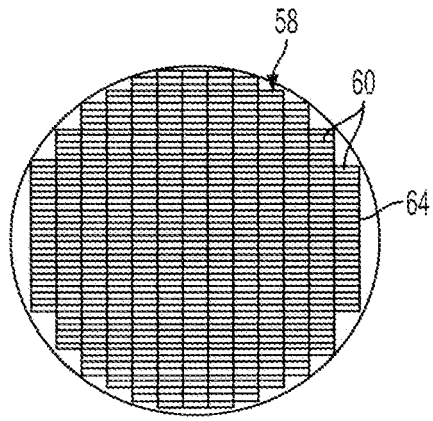
FIG. 6 is a top view of a silicon wafer according to one step of the process of FIG. 5.
Figure 7:
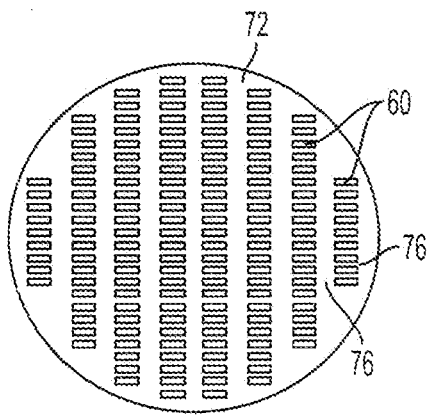
FIG. 7 is a top view of redistributed silicon die according to another step of the process of FIG. 5.
Figure 8:
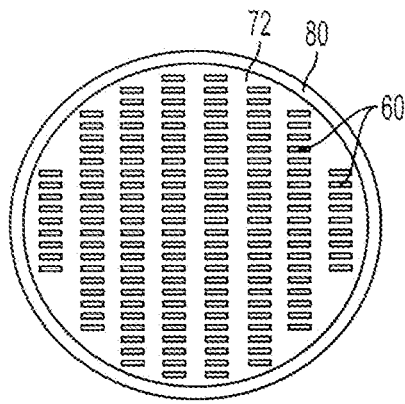
FIG. 8 is a top view of the redistributed silicon die according to another step of the process of FIG. 5.
Figure 9:
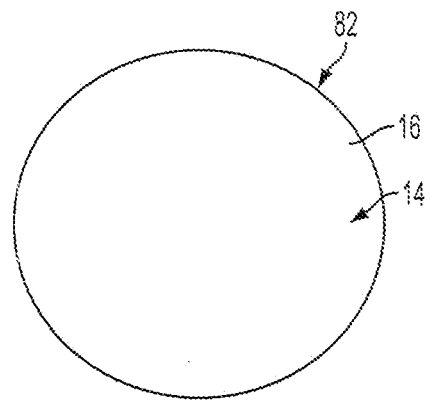
FIG. 9 is a top view of the redistributed silicon die according to another step of the process of FIG. 5.

FIGS. 5-12 illustrate a wafer-level fan out ("WLFO") process for fabricating the fingerprint sensor package 10 according to an aspect of the disclosed subject matter. First, as shown in FIG. 6, at step 56, a silicon wafer 58 containing a plurality of die 60 (i.e., forming electronic circuitry such as the sensor integrated circuits 28 of FIGS. 1, 2 and 4) can be probed to test the functionality of each die 60. At step 62, the silicon wafer 58 can be mounted onto a film 64, which provides support during sawing of the die 60. At step 66, the die 60 can be sawed apart and cleaned and, at step 68, each die 60 can be marked (e.g., with a bar code label, not shown) for identification purposes. At step 70, an adhesive can be applied to a sticky tape 72 or similar product for receiving the separated die 60. At step 74, separate die 60 can be redistributed onto the sticky tape 72 with sufficient spacing 76 between each die 60, as shown in FIG. 7. At step 78, a mold ring 80 can be placed around the sticky tape 72, as shown in FIG. 8, and the mold filler 16 can be filled around and over the redistributed die 60 to create a new wafer 82 of partially-constructed packages, as shown in FIG. 9. The mold filler 16 can be added at a height or thickness to completely cover the die 60, i.e., rendering them not visible from the side of the molded wafer 82 shown in FIG. 9. For example, in one aspect, the mold filler 16 can have a height or thickness of between about 700 micrometers and about 800 micrometers. At step 84, the new wafer 82 can be demounted from the sticky tape 72, i.e., exposing the die 60 on the opposite side from that shown in FIG. 9.

Figure 10:
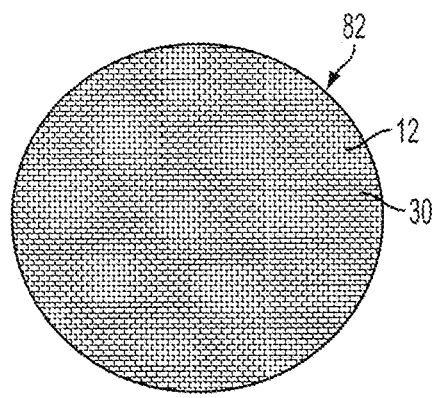
FIG. 10 is a bottom view of the redistributed silicon die according to another step of the process of FIG. 5.
Figure 11:
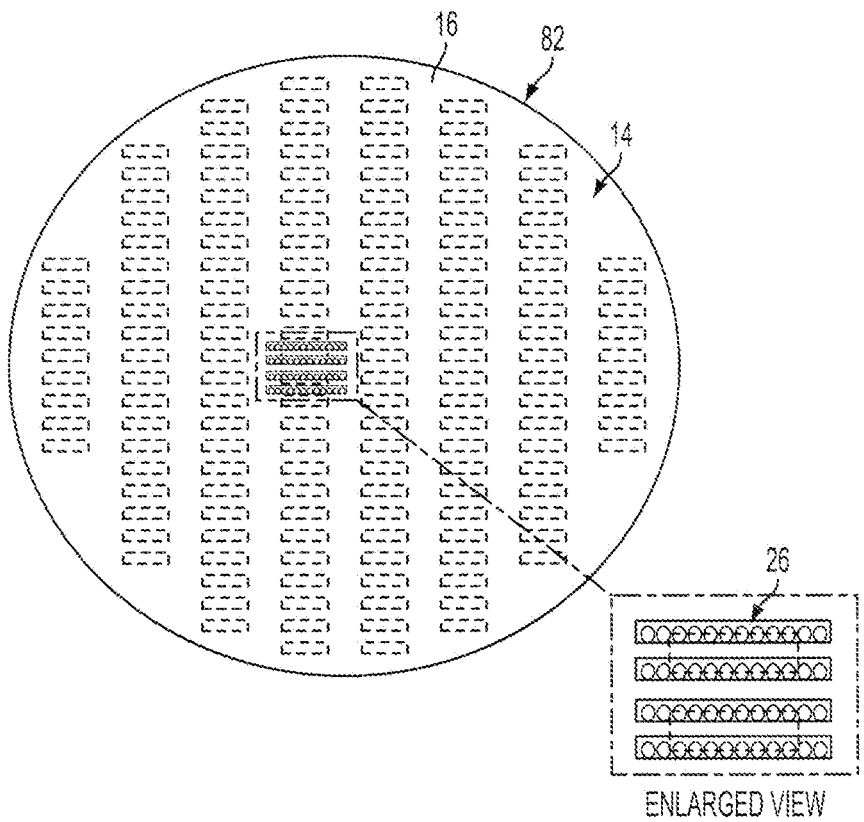
FIG. 11 is a partly enlarged bottom view of the redistributed silicon die according to another step of the process of FIG. 5.

At steps 86 and 88, the new wafer 82 can be turned over for processing of layers on the sensing side 12, as shown in FIG. 10. More specifically, at step 86, the sensing side redistribution layer 30, as described above, can be applied to the sensing side 12. The sensing side redistribution layer 30 can include a metal layer 36 positioned between a first passivation layer 38 and a second passivation layer 40, as described above. The metal layer 36 can provide for electrical connections 46 on each die 60, such as bond pads, to connection locations 48 beside, or around, each die 60 (e.g., within the spacing 76 in the mold filler 16 between the die 60). The metal layer 36 can also provide the sensor array (not shown) for providing the image sensor drive and pick-up connections and/or the velocity sensor drive and pick-up connections, as appropriate. In some aspects, the sensing side redistribution layer 30 can substantially cover the entire circuit side 42 of the sensor integrated circuit 28. In other aspects, the sensing side redistribution layer 30 can provide an opening to expose the embedded pixel array on the sensor integrated circuit 28. At step 88, the entire sensing surface 12 of the new wafer 82, including the sensing side redistribution layer 30, can be coated with the sensing side coating layer 32, which can be ink or another suitable hard coating material. In some aspects, the embedded pixel array (not shown) can also be coated by the sensing side coating layer 32. In other aspects, the embedded pixel array (not shown) can remain exposed.

In some aspects, the sensing side redistribution layer 30 can have a thickness between about 22.5 micrometers and about 31 micrometers. For example, the first passivation layer 38, e.g., formed of a dielectric, such as, amorphous silicon dioxide ("$SiO_2$"), can have a thickness of about 11 micrometers, the metal layer 36 can have a thickness of about 9 micrometers, and the second passivation layer 40, e.g., also of SiO$_2$ can have a thickness of about 11 micrometers. In addition, in some aspects, the sensing side coating layer 32 can have a thickness of between about 15 micrometers and 25 micrometers. In some aspects, the thickness of the second passivation layer 40 and the sensing side coating layer 32 may be thin enough to allow sufficient sensing of fingerprint information by the sensor array (not shown), which may be formed, e.g., in the metal layer 36 or on the sensor side 42 of the integrated circuit 28.

Following processing of the sensing side 12, the new wafer 82 can be turned over for processing of the connection side 14. At step 90, the mold filler 16 can be laser ablated from the connection side 14 to create vias 44 in line with the electrical redistribution connection locations 48 on the sensing side 12. At step 92, the connection side redistribution layer 34 can be applied to the connection side 14 including, at step 94, applying a copper layer 34 to the connection side 14 and, at step 96, etching the copper to provide routing connections, e.g., from the vias 44 to BGA 25 connection points 50. Also, at step 96, etching of the copper can provide electrostatic discharge traces 54, as described above, between the die 60. At step 98, the vias 44 can be filled with a filler material 52 and at step 100, the BGA 25 solder balls 26 can be attached at the BGA 25 connection points 50, as shown, e.g., in FIGS. 4 and 11.

Figure 12:
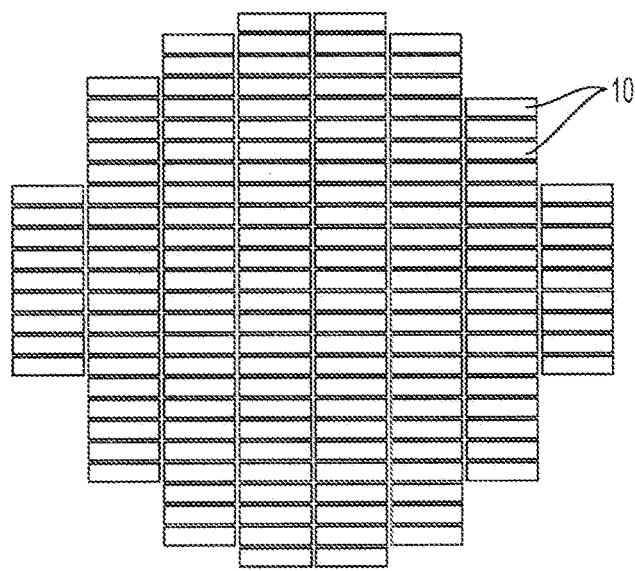
FIG. 12 is a top view of a plurality of separated fingerprint sensor packages according to another step of the process of FIG. 5.

Following attachment of the BOA 25 solder balls 26, the packages can be laser marked (e.g., on the connection side 14) at step 102 with additional identification information. At step 104, final testing can be performed on the packages. At step 106, individual fingerprint sensor packages 10 can be separated, as shown in FIG. 12, followed by a final visual inspection at step 108 and packing for shipment at step 110.

In some aspects, the fingerprint sensor package 10, as shown in FIGS. 1-4, can have a length of about 11 millimeters and a width of about 2.5 millimeters. The area of the sensor array on the sensing side 12 can be about 20 micrometers by about 100 micrometers, or less, in some aspects. The length and the width of the fingerprint sensor package 10 can be substantially smaller than conventional fingerprint sensor packages, which can permit a smaller opening 22 within the housing 24 of the host device 18 for the fingerprint sensor package 10. In addition, the connection side 14 of the fingerprint sensor package 10 can be surface mounted to the substrate 20 of the device 18 directly below the opening 22. As a result, the fingerprint sensor package 10 can take up less space compared to conventional fingerprint sensor packages which may require additional space on the underside of the housing 24 for connection to the device substrate 20.

Figure 13:
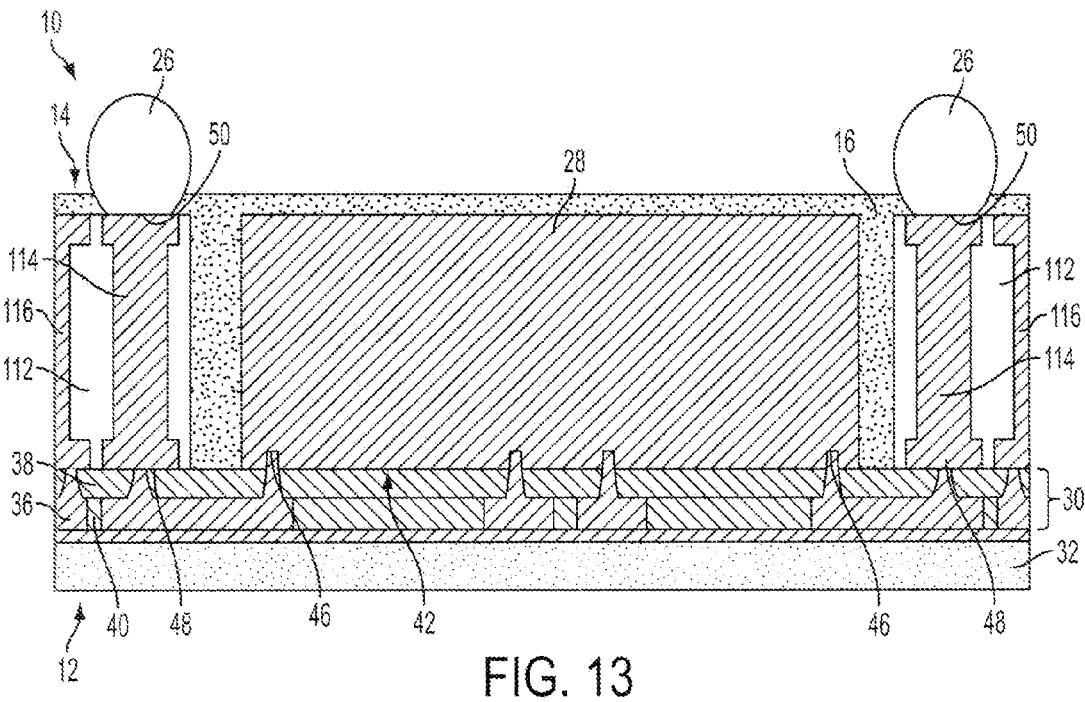
FIG. 13 is a cross-sectional view of another embodiment of a fingerprint sensor package.
Figure 14:
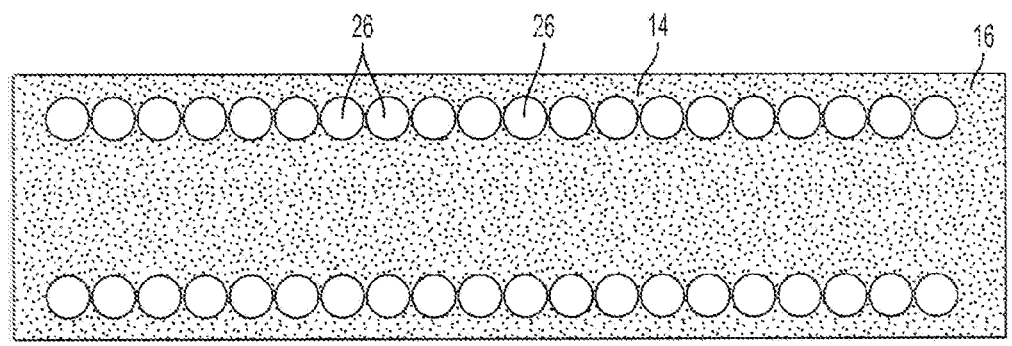
FIG. 14 is a bottom view of a connection side of an isolated fingerprint sensor package of FIGS. 11-13.

FIGS. 13-17B illustrate the fingerprint sensor package 10 according to another embodiment of the disclosed subject matter. As shown in FIG. 13, the fingerprint sensor package 10 can include a sensor integrated circuit 28, mold filler material 16, a sensing side electrical redistribution layer 30, a sensing side coating layer 32, and a BGA 25, with solder balls 26. The fingerprint sensor package 10 can also include interposer boards 112 on either side of the sensor integrated circuit 28. The interposer boards 112 can include plated and/or metal-filled vias 114. On the sensing side 12, the sensing side redistribution layer 30 can electrically connect the connections 46 of the sensor integrated circuit 28 with connections 48 for the vias 114. In one embodiment, on the connection side 14, the BGA 25 solder balls 26 can be attached directly to connection points 50 on each of the vias 114, as shown in FIGS. 13 and 14. In another embodiment, the BGA 25 solder balls 26 can be connected to the vias 114 through a connection side redistribution layer (not shown).

As shown in FIG. 13, the fingerprint sensor package 10 can also include ESD discharge castellations 116 (e.g., partial vias). The ESD discharge castellations 116 can at least partially surround the outer edges of the fingerprint sensor package 10 and can be electrically connected to a known potential, such as ground, in order to provide a dissipation pathway for ESD and to protect the sensor integrated circuit 28. In some aspects, the ESD discharge castellations 116 can be formed from the vias 114 on the interposer boards 112 which are substantially split in half, as described below.

Figure 15:
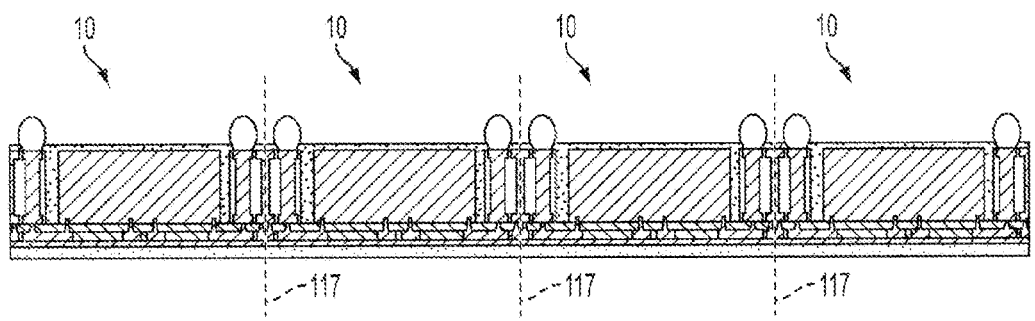
FIG. 15 is a cross-sectional view of a plurality of fingerprint sensor packages of FIG. 13 prior to separation.

As shown in FIG. 15, multiple fingerprint sensor packages 10 can be fabricated in wafer form and then sawed apart (e.g., along saw lines 117). For example, in one embodiment, the fingerprint sensor packages 10 can be fabricated according to the following method.

Figure 16:
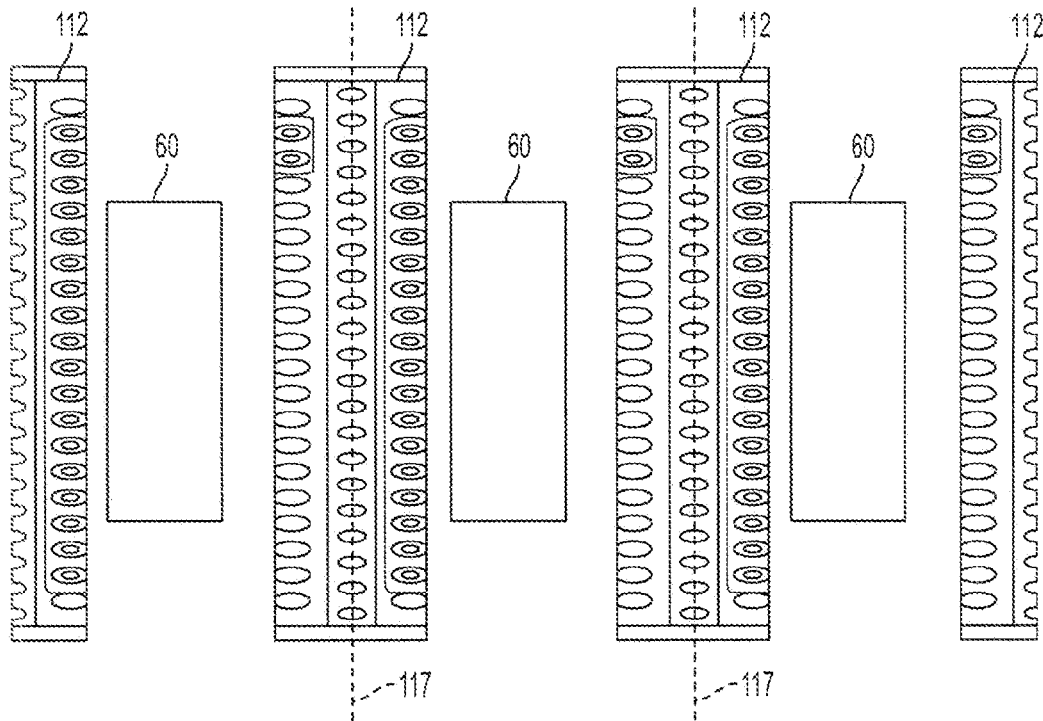
FIG. 16 is an exploded view of redistributed silicon die and interposer boards prior to separation during fabrication of the fingerprint sensor packages of FIGS. 13-15.
Figure 17A:
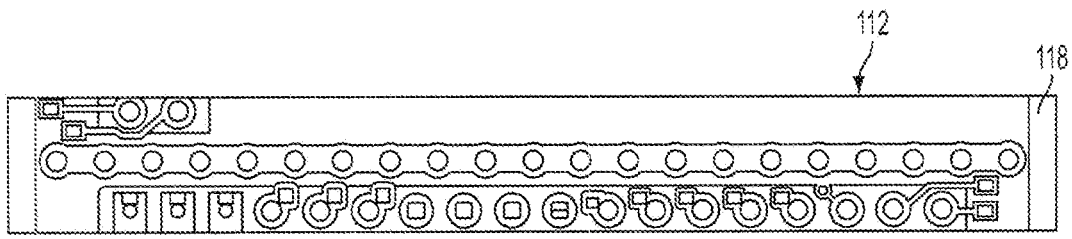
FIG. 17A is a top view of a sensing side of an interposer board of the fingerprint sensor package of FIGS. 13-15.
Figure 17B:
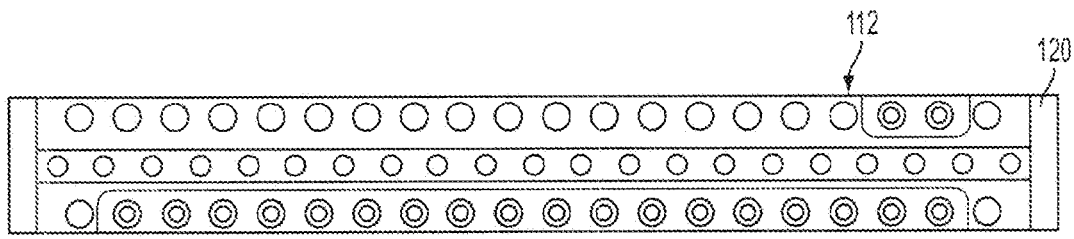
FIG. 17B is a bottom view of a connection side of the interposer board of the fingerprint sensor package of FIGS. 13-15.

A silicon wafer including a plurality of die 60 (i.e., sensor integrated circuits 28) can be sawed apart and the die 60 can be distributed on a sticky tape or similar material so that the circuit side 42 of the die 60 are attached to the sticky tape. Also, a panel of interposer boards 112 can be split apart and the individual interposer boards 112 can be distributed onto the sticky tape in between the die, for example in the orientation shown in FIG. 16. FIG. 17A illustrates an example sensing side 118 of the interposer boards 112 which can be applied to the sticky tape, and later electrically connected to the die 60, as described below. FIG. 17B illustrates an example connection side 120 of the interposer boards 112, which can later be connected to BGA 25 solder balls 26, as described below.

After the die 60 and the interposer boards 112 are distributed onto the sticky tape, the mold filler 16 can be applied to substantially cover and fill between the die 60 and the interposer boards 112, substantially fixing the die 60 and the interposer boards 112 in place in relation to one another and creating a new wafer. The sticky tape can be removed and a sensing side redistribution layer 30 can be applied to the sensing side 12 of the new wafer. The sensing side redistribution layer 30 can electrically connect the die 60 and the interposer boards 112, as described above. The sensing side redistribution layer 30 can also include the metal sensor array (not shown) including the image sensor drivers and pick-ups (not shown) and/or the velocity sensor drivers and pick-ups (not shown). The sensing side redistribution layer 30 can be coated, for example with a sensing side coating layer 32. The connection side 14 of the new wafer can be laser ablated to expose BGA 25 solder ball 26 connection points 50 on the interposer boards 112 and the BGA 25 solder balls 26 can then be applied to the BGA 25 solder ball 26 connection points 50. The new wafer can then be sawed apart at the saw lines 117, as shown in FIGS. 15 and 16, substantially splitting each of the interposer boards 112 to separate individual fingerprint sensor packages 10 and to expose the ESD discharge castellations 116 along at least some of the outer side walls of each of fingerprint sensor packages 10. Metal layers can also be added on the other side walls.

In one embodiment, the fingerprint sensor package 10, as shown in FIGS. 13-17B, can have a thickness of about 1.1 millimeters. For example, the sensing side coating layer 32 can be about 25 micrometers thick, the sensing side redistribution layer 30 can be about 22.5 micrometers thick, the mold filler 16 can be about 800 micrometers thick (e.g., to substantially cover the sensor integrated circuit 28, which can be about 620 micrometers in thickness), and the BGA 25 solder balls 26 height can be about 250 micrometers. In addition, in some aspects, the fingerprint sensor package 10, as shown in FIGS. 13-17B, can have a length less than about 12 millimeters and a width less than about 3 millimeters. The area of the sensor array (not shown) on the sensing side 12 can be about 20 micrometers by about 5 micrometers, or less in some aspects.

Figure 18:
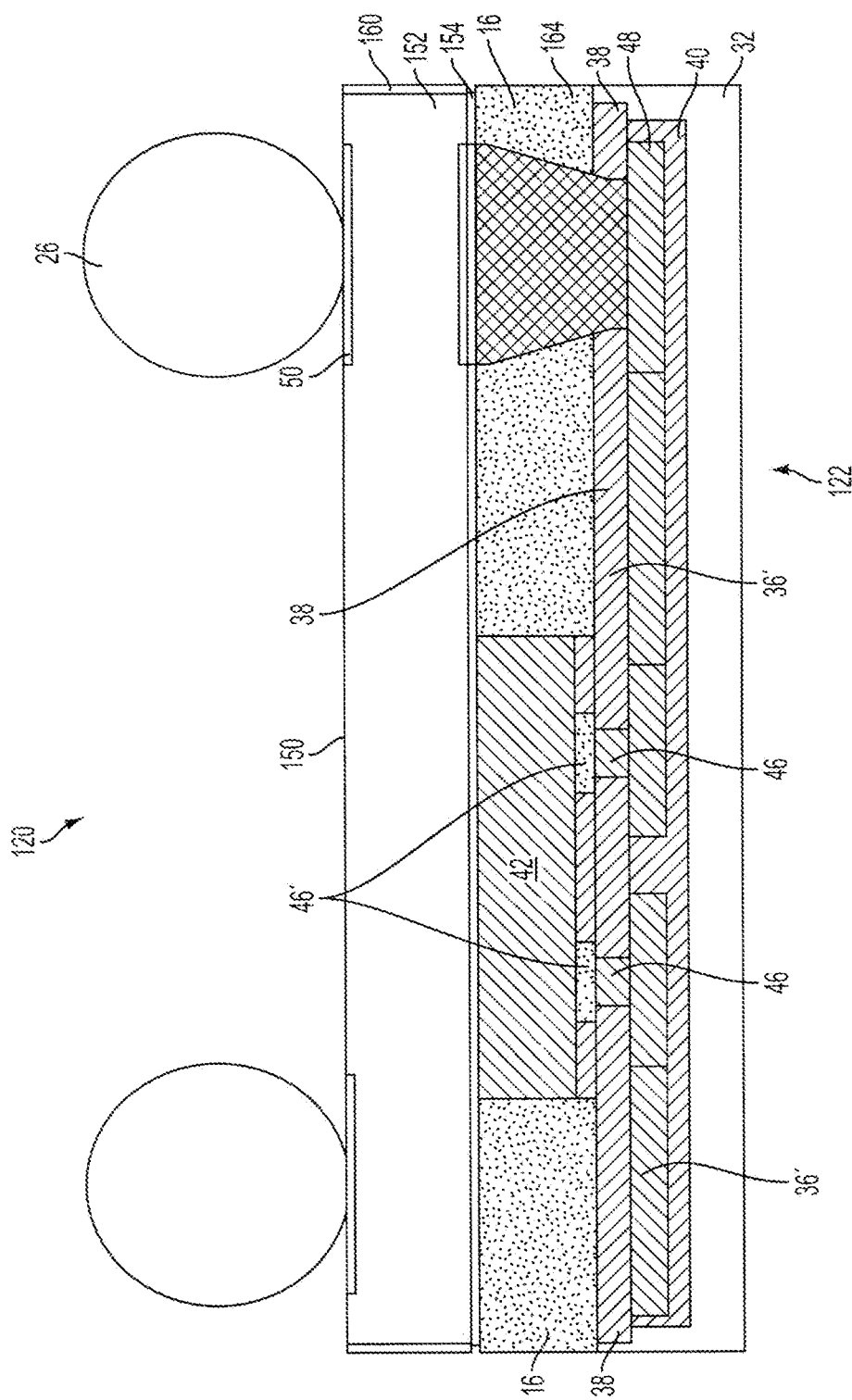
FIG. 18 is a cross-sectional view of an additional possible embodiment of the disclosed subject matter.
Figure 19:
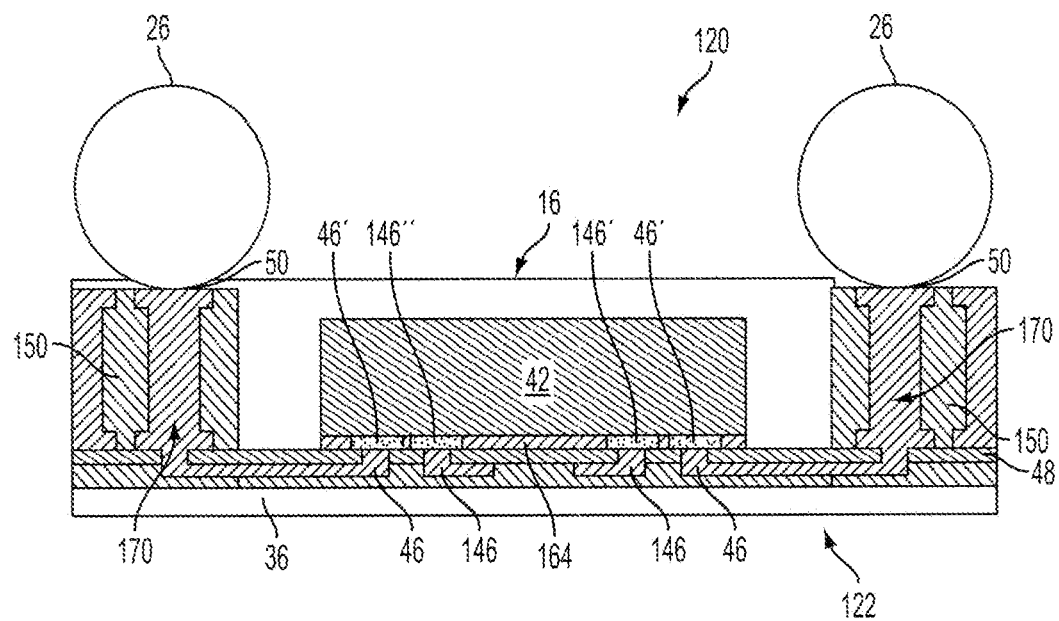
FIG. 19 is a cross-sectional view of an additional possible embodiment of the disclosed subject matter.
Figure 20:
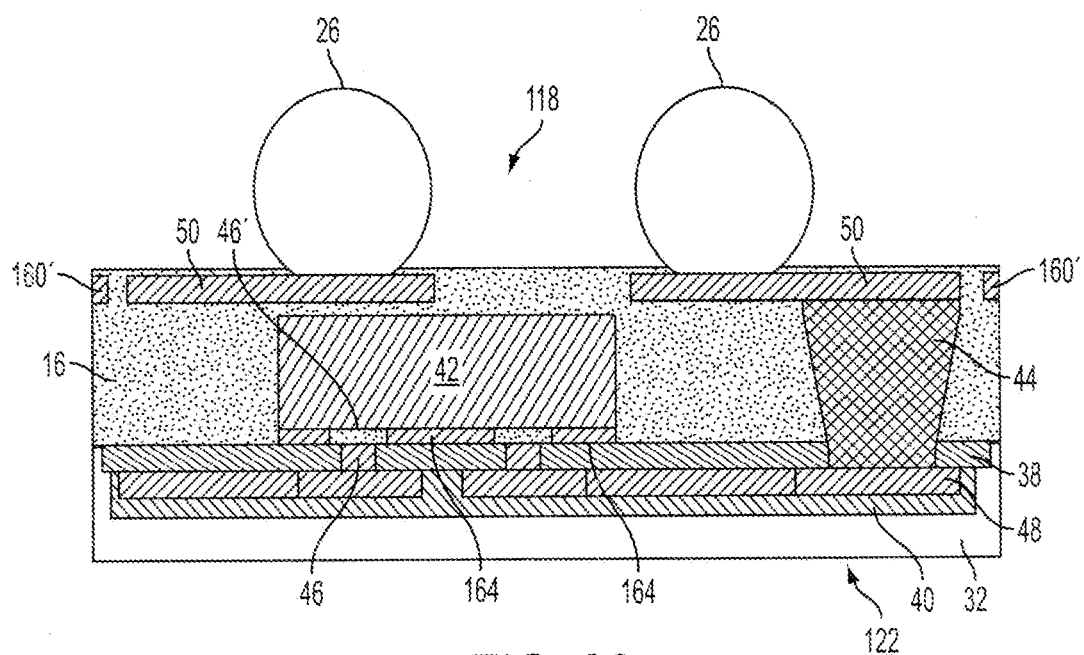
FIG. 20 is a cross-sectional view of an additional possible embodiment of the disclosed subject matter.

Turning now to FIGS. 18-20 there are shown cross sectional views of other possible embodiments of the disclosed subject matter. Another embodiment of the sensor package 10, as illustrated by way of example in FIG. 18 can have the connection side 14 including a multilayer printed circuit board ("MLPCB") 150. The MLPCB 150 may have mounted on it solder balls 26 forming the ball grid array 25, mounted on solder ball connection pads 50. The solder ball connection pads 50 can be connected electrically to the metal layers in the sensing side 14 of the fingerprint sensor WLFO package through TMV vias 44 formed in the fill material 16, and internal vias in the PCB 150 (not shown). The TMV vias 44 may be connected to electrical connectors 50 on the PCB 150 through solder 152 and the PCB 150 may be connected to the WLFO package through a layer of adhesive 154. FIGS. 18-20 also illustrate metal pad 46' connecting the vias 46 to the silicon of the IC device 42. FIGS. 18-20 also illustrate a SiPO dielectric layer 164. The WLFO package of FIG. 19 has the fill material 16 in an opening in a PCB layer 150, such that the fill material 16 surrounds and encapsulates the IC die 42. Also through vias 170 in the PCB layer material, filled with conducting material can provide electrical connection between the solder ball mounting plates 50 and the metal layers on the sensing side 12 of the package 10. FIG. 19 also illustrates an example of sensor traces 146 connected to metal pads 146,' e.g., forming the drive plates and pick-up plates of the sensor devices. The WLFO package of FIG. 20 illustrates the fill layer 16 extending all the way to the outer surface of the connection side, except for ball metal traces 50 and vias 44 and an ECD ring 160'.

If a package constructed using a supporting filler, such as a wafer level fan out ("WLFO") construction technique, and uses through is made with through-mold vias ("TMVs") formed through the molded filler material, the package can be made much thinner. It is, also, much easier to do the TMV, if the WLFO is connected to a multilayer printed circuit board "PCB". Multilayer PCBs are relatively cheap, and can also be used to adjust the height of the package very easily. A connection to a common reference voltage, e.g., a grounded connection "EGND" 160 could be placed around the edge of the PCB 150, as seen, e.g., in FIG. 18 or 160' around the bottom lip, as seen, e.g., in FIG. 20, for ESD protection. The WLFO with TMV can be connected to the PCB 150 portion of the package 10 with solder 152 and adhesive 154 (e.g., seen in FIG. 18). Cost could be reduced from a thicker WLFO plus TMV package, e.g. as seen in FIGS. 19 and 20, because the thickness of the WLFO with TMV can then be greatly reduced. This can also reduce the amount of time required for the TMV laser ablation formation process.

Figure 21:
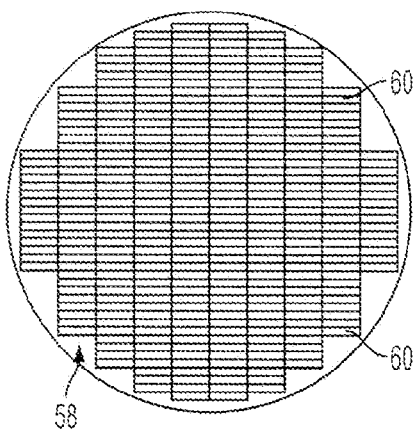
FIG. 21 shows a wafer populated with a plurality of die forming a plurality of main fingerprint imaging sensor circuitry integrated circuits.
Figure 22:
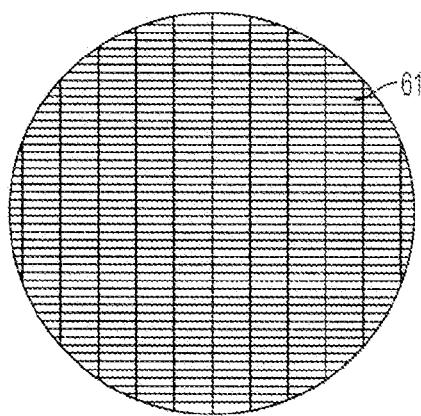
FIG. 22 shows a secondary IC, such as containing micro-metalizations forming, e.g., biometric object sensing elements like capacitive coupled drivers and pick-ups or electronic circuits, such as like light emitting diodes ("LEDS") according to aspects of the disclosed subject matter.
Figure 23:
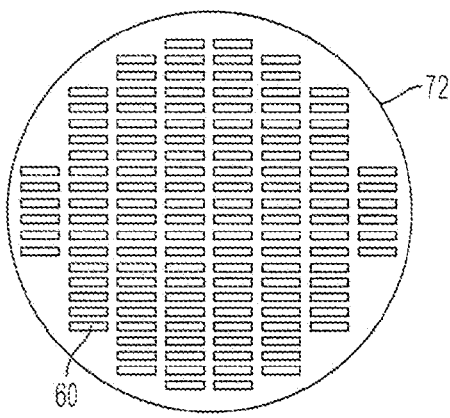
FIG. 23 shows an example of redistribution of the fingerprint sensor into a co-molded wafer ("CMW") according to aspects of embodiments of the disclosed subject matter.
Figure 24:
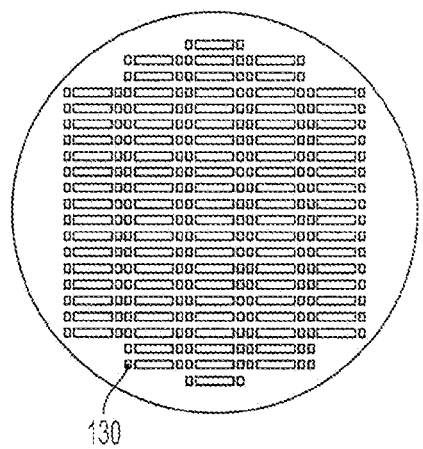
FIG. 24 illustrates redistribution of fingerprint sensor ICs and secondary ICs into a co-molded wafer ("CMW") according to aspects of embodiments of the disclosed subject matter.
Figure 25:
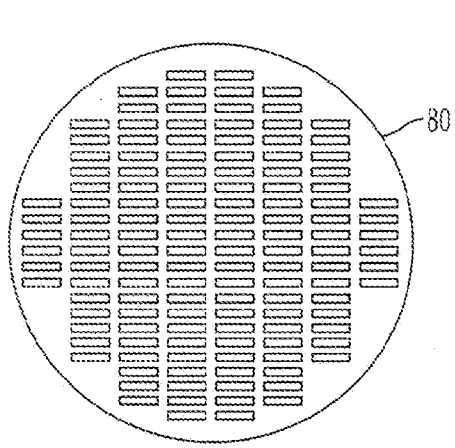
FIG. 25 illustrates the placement of a mold ring around the CMW according to aspects of embodiments of the disclosed subject matter.
Figure 26:
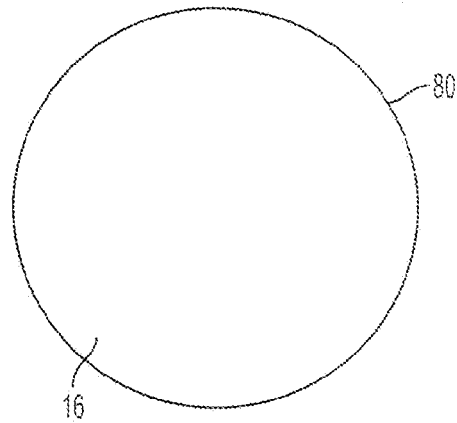
FIG. 26 shows an example of the injection of fill material to further form the CMW according to aspects of embodiments of the disclosed subject matter.
Figure 27:
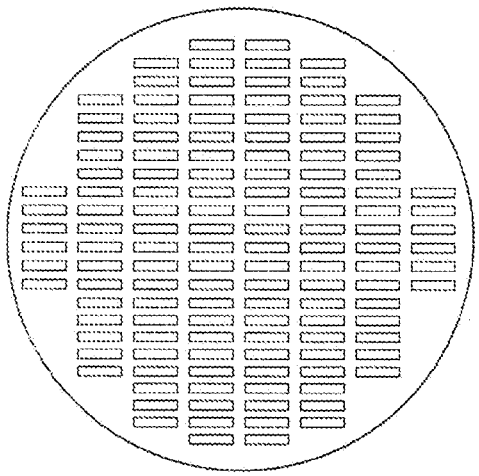
FIG. 27 illustrates a top view of the CMW prior to the application electrical redistribution layers according to aspects of embodiments of the disclosed subject matter.
Figure 28:
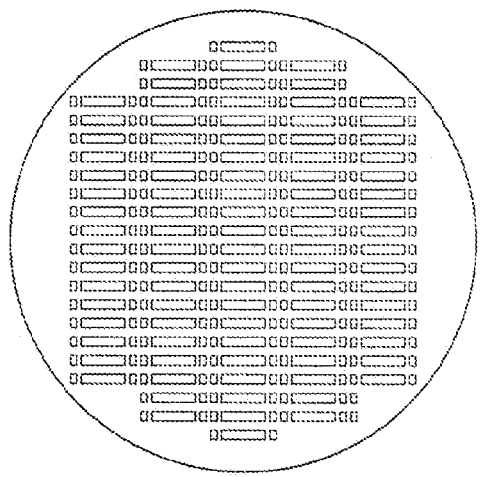
FIG. 28 also illustrates a top view of CMW prior to RDL layers being applied, according to aspects of embodiments of the disclosed subject matter.
Figure 29:
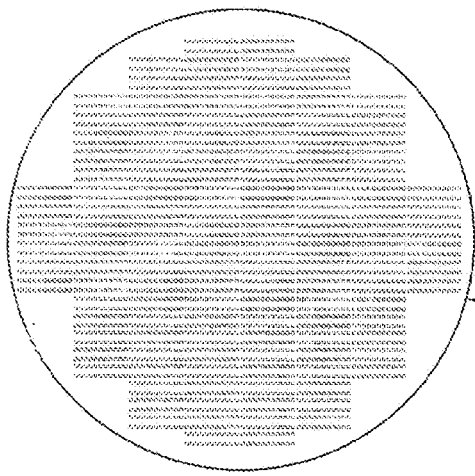
FIG. 29 illustrates the placement of solder balls on the CMW according to aspects of embodiments of the disclosed subject matter.
Figure 30:
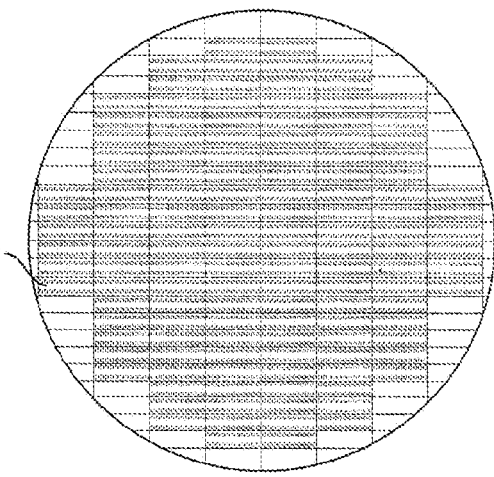
FIG. 30 illustrates a top view of the sawing apart of CMWs into individual WLFO packaged devices.
Figure 31:
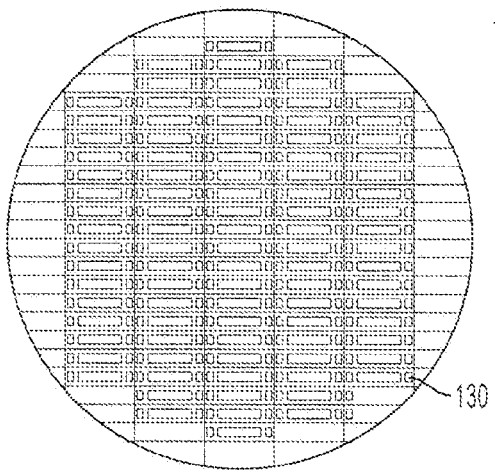
FIG. 31 illustrates a bottom view of the sawing of the CMW into individual WLFO packaged devices.

FIG. 21 shows a wafer 58 populated with a plurality of die 60 forming a plurality of main fingerprint imaging sensor circuitry integrated circuits. FIG. 22 shows a wafer of secondary ICs 61, such as, containing electronic circuits, such as light emitting diodes ("LEDS") 130, or other items utilized with or ancillary to or complimentary of the actual biometric object sensor controller IC 42, and to be contained in the same package, e.g., formed within the molded filler material 16 along with the IC 42, according to aspects of the disclosed subject matter. FIG. 23 shows an example of redistribution of the finger print sensor into a co-molded wafer ("CMW") 72 according to aspects of embodiments of the disclosed subject matter. FIG. 24 illustrates redistribution of fingerprint sensor ICs and secondary ICs into a co-molded wafer ("CMW") 72 according to aspects of embodiments of the disclosed subject matter. FIG. 25 illustrates the placement of a mold ring 80 around the CMW 72 according to aspects of embodiments of the disclosed subject matter. FIG. 26 shows an example of the injection of fill material 16 to further form the CMW 72 according to aspects of embodiments of the disclosed subject matter. FIG. 27 illustrates a top view of the CMW 72 prior to the application electrical redistribution layers. FIG. 28 also illustrates a top view of CMW prior to RDL layers being applied, according to aspects of embodiments of the disclosed subject matter. FIG. 29 illustrates the placement of solder balls 26 on the CMW 72 to form ball grid arrays 25, according to aspects of embodiments of the disclosed subject matter. FIG. 30 illustrates the sawing apart of CMWs 72 into individual WLFO packaged devices 10. FIG. 31 also illustrates the sawing of the CMW into individual WLFO packaged devices.

While preferred embodiments of the present disclosed subject matter have been shown and described herein, it will be obvious to those skilled in the art that such embodiments are provided by way of example only. Numerous variations, changes, and substitutions will now occur to those skilled in the art without departing from the disclosed subject matter. It should be understood that various alternatives to the embodiments of the disclosed subject matter described herein may be employed in practicing the disclosed subject matter. It is intended that the following claims define the scope of the disclosed subject matter and that methods and structures within the scope of these claims and their equivalents be covered thereby.

What is claimed is:

1. A biometric object sensor wafer level fan out package, comprising:
   a sensor control integrated circuit;
   a molded fill material formed to at least partially encapsulate the sensor control integrated circuit;
   a sensing side redistribution layer disposed on a sensing side of the package, wherein the sensing side redistribution layer comprises at least one passivation layer and a metal layer, wherein the metal layer of the sensing side redistribution layer further comprises metal redistribution traces and a metal sensor array in the sensing side redistribution layer, the metal sensor array further including a plurality of capacitively coupled drivers and pick-ups configured to detect ridges and valleys of a fingerprint;
   a connection side redistribution layer disposed on a connection side of the package, wherein the connection side of the package is on an opposite side of the package relative to the sensing side;
   at least one ball grid array electrical connector mounted on the connection side redistribution layer; and
   a protective coating on the sensing side of the package disposed on the sensing side redistribution layer.

2. The package of claim 1, wherein the molded fill material completely encapsulates the sensor control integrated circuit.

3. The package of claim 1, wherein the at least one ball grid array electrical connector is connected to the sensing side of the package through a through mold via.

4. The package of claim 1, further comprising:
   a printed circuit board disposed on the connection side of the package between the at least one ball grid array electrical connector and the sensor control integrated circuit.

5. The package of claim 1, wherein the molded fill material is formed in an opening of a printed circuit board containing the sensor control integrated circuit.

6. The package of claim 1, wherein the package is a fingerprint sensor package.

7. The package of claim 1, further comprising:
an interposer board disposed between the sensing side redistribution layer and the connection side redistribution layer.

8. The package of claim 1, wherein the connection side redistribution layer comprises a multilayer printed circuit board.

9. The package of claim 1, wherein the at least one passivation layer comprises a first passivation layer disposed between the sensor control integrated circuit and the metal layer.

10. The package of claim 9, wherein the at least one passivation layer further comprises second passivation layer, wherein the metal layer is disposed between the first passivation layer and the second passivation layer.

11. The package of claim 1, further comprising:
a secondary integrated circuit formed within the molded fill material along with the sensor control integrated circuit.

12. The package of claim 11, wherein the secondary integrated circuit includes a light emitting diode.

* * * * *